US009985066B2

(12) United States Patent
Noudo et al.

(10) Patent No.: US 9,985,066 B2
(45) Date of Patent: May 29, 2018

(54) SOLID-STATE IMAGING DEVICE, METHOD FOR MANUFACTURING SAME, AND ELECTRONIC DEVICE

(71) Applicant: SONY CORPORATION, Tokyo (JP)

(72) Inventors: Shinichiro Noudo, Kumamoto (JP); Yoichi Ootsuka, Kumamoto (JP)

(73) Assignee: Sony Corporation, Tokyo (JP)

( * ) Notice: Subject to any disclaimer, the term of this patent is extended or adjusted under 35 U.S.C. 154(b) by 254 days.

(21) Appl. No.: 14/773,157

(22) PCT Filed: Mar. 6, 2014

(86) PCT No.: PCT/JP2014/055739
§ 371 (c)(1),
(2) Date: Sep. 4, 2015

(87) PCT Pub. No.: WO2014/141991
PCT Pub. Date: Sep. 18, 2014

(65) Prior Publication Data
US 2016/0013233 A1 Jan. 14, 2016

(30) Foreign Application Priority Data
Mar. 15, 2013 (JP) ................................. 2013-054248

(51) Int. Cl.
*H01L 27/00* (2006.01)
*H01L 27/146* (2006.01)
(Continued)

(52) U.S. Cl.
CPC .... *H01L 27/14627* (2013.01); *H01L 27/1464* (2013.01); *H01L 27/14623* (2013.01);
(Continued)

(58) Field of Classification Search
CPC .......... H01L 27/1464; H01L 27/14625; H01L 27/14627
(Continued)

(56) References Cited

U.S. PATENT DOCUMENTS

| 8,928,784 B2 * | 1/2015 | Watanabe | H01L 27/1464 257/291 |
| 8,951,823 B2 * | 2/2015 | Masuda | H01L 27/14623 257/294 |
| 2009/0014823 A1 | 1/2009 | Kokusenya | |

FOREIGN PATENT DOCUMENTS

| CN | 102483510 A | 5/2012 |
| CN | 102651378 A | 8/2012 |

(Continued)

OTHER PUBLICATIONS

International Search Report prepared by the Japanese Patent Office dated May 20, 2014, for International Application No. PCT/JP2014/055739.
(Continued)

*Primary Examiner* — Kevin Pyo
(74) *Attorney, Agent, or Firm* — Sheridan Ross P.C.

(57) ABSTRACT

There is provided a solid state imaging device including a plurality of imaging pixels arranged two-dimensionally in a matrix configuration and phase difference detecting pixels arranged scatteredly among the imaging pixels, the solid state imaging device including: a first microlens formed for each of the imaging pixels; a planarization film having a lower refractive index than the first microlens and formed on the first microlens; and a second microlens formed only on the planarization film of the phase difference detecting pixel.

20 Claims, 22 Drawing Sheets

(51) Int. Cl.
 H04N 5/369 (2011.01)
 H04N 5/357 (2011.01)
(52) U.S. Cl.
 CPC ..... H01L 27/14685 (2013.01); H04N 5/3572 (2013.01); H04N 5/3696 (2013.01)
(58) Field of Classification Search
 USPC ................... 250/208.1, 214.1; 257/432, 433
 See application file for complete search history.

(56) References Cited

FOREIGN PATENT DOCUMENTS

| JP | 2005-016841 A | 1/2005 |
|---|---|---|
| JP | 2007-158109 A | 6/2007 |
| JP | 2007-281296 | 10/2007 |
| JP | 2008-071920 | 3/2008 |
| JP | 2009-017058 A | 1/2009 |
| JP | 2009-021415 A | 1/2009 |
| JP | 2009-064839 A | 3/2009 |
| JP | 2010-245202 A | 10/2010 |
| JP | 2010-245202 A | 10/2010 |
| JP | 2012-175461 A | 9/2012 |
| JP | 2013-038164 A | 2/2013 |
| JP | 2013-509092 A | 3/2013 |
| WO | WO 2011/061998 | 5/2011 |

OTHER PUBLICATIONS

Official Action (and its English translation) issued for Chinese Application No. 201480005896.0 dated Jul. 17, 2017, 19 pages.
Official Action (and its English translation) issued for Japanese Application No. 2015-505430 dated Jun. 20, 2017, 12 pages.

\* cited by examiner

SOLID-STATE IMAGING DEVICE, METHOD FOR MANUFACTURING SAME, AND ELECTRONIC DEVICE

CROSS REFERENCE TO RELATED APPLICATIONS

This application is a national stage application under 35 U.S.C. 371 and claims the benefit of PCT Application No. PCT/JP2014/055739 having an international filing date of Mar. 6, 2014, which designated the United States, which PCT application claimed the benefit of Japanese Patent Application No. 2013-054248 filed Mar. 15, 2013, the disclosures of which are incorporated herein by reference in their entirety.

TECHNICAL FIELD

The present invention relates to a solid state imaging device, a method for manufacturing the same, and an electronic device, and relates particularly to a solid state imaging device that can make good both the oblique incident light characteristics of an imaging pixel and the AF characteristics of a phase difference detecting pixel, a method for manufacturing the same, and an electronic device.

BACKGROUND ART

Back-side illumination solid state imaging devices are known for, because of an interconnection layer being formed on the opposite side to a light receiving surface, being capable of reducing the height of the light collection structure and being capable of achieving good oblique incident light characteristics, as compared to front-side illumination solid state imaging devices.

There is known a solid state imaging device in which phase difference detecting pixels in which part of a photoelectric conversion unit is shielded from light are provided among ordinary imaging pixels and thereby phase difference detection is performed. In the phase difference detecting pixel, it is necessary to increase the distance between a microlens and a light blocking film in order to bring the light collection point onto the light blocking film, that is, to increase the height of the light collection structure.

Here, in the case where a phase difference detecting pixel is provided in a back-side illumination solid state imaging device, a trade-off occurs in which height reduction is required in order to obtain oblique incident light characteristics of the imaging pixel and at the same time height increase is required in order to obtain AF characteristics of the phase difference detecting pixel.

To solve the trade-off, an imaging element is proposed in which, while the height of the microlens is equalized between the imaging pixel and the phase difference detecting pixel, the light receiving element of the phase difference detecting pixel is formed low (see Patent Literature 1). Furthermore, it is disclosed that the imaging distance of the phase difference detecting pixel is ensured by providing a level difference for the microlens of the phase difference detecting pixel (see Patent Literature 2).

CITATION LIST

Patent Literature

Patent Literature 1: JP 2008-71920A
Patent Literature 2: JP 2007-281296A

SUMMARY OF INVENTION

Technical Problem

However, in the structure of Patent Literature 1, since the film thickness of a Si substrate is different between the imaging pixel and the phase difference detecting pixel, it has been necessary to separate the potential design and the ion implantation process for the imaging pixel and the phase difference detecting pixel. Furthermore, there has been a concern that the interface state will be disordered due to damage from etching during engraving the light receiving element and this will influence the characteristics during dark times.

Furthermore, in Patent Literature 2, a specific method for providing a level difference for the microlens of the phase difference detecting pixel is not disclosed; and vignetting will occur due to reflection at a wall portion formed by the level difference and therefore degradation in the oblique incident light characteristics of the imaging pixel has been unavoidable.

The present technology is developed in view of such circumstances, and can make good both the oblique incident light characteristics of the imaging pixel and the AF characteristics of the phase difference detecting pixel.

Solution to Problem

According to an implementation of the present technology, there is provided a solid state imaging device including a plurality of imaging pixels arranged two-dimensionally in a matrix configuration and phase difference detecting pixels arranged scatteredly among the imaging pixels, the solid state imaging device including: a first microlens formed for each of the imaging pixels; a planarization film having a lower refractive index than the first microlens and formed on the first microlens; and a second microlens formed only on the planarization film of the phase difference detecting pixel.

The first microlens may be formed also in the phase difference detecting pixel.

A refractive index of the planarization film may be set to 1.5 or less and a refractive index of the first and second microlenses may be set to 1.4 or more.

The second microlens may have same composition as the planarization film.

The planarization film may be formed by fluorine or hollow silica being added to an acrylic-based resin or a siloxane-based resin.

The first and second microlenses may be made of an organic material of a styrene-based resin, an acrylic-based resin, a styrene-acrylic copolymer-based resin, or a siloxane-based resin.

The first and second microlenses may be made of an organic-inorganic hybrid material in which TiO fine particles are dispersed in a styrene-based resin, an acrylic-based resin, a styrene-acrylic copolymer-based resin, a siloxane-based resin, or a polyimide resin.

The first and second microlenses may be made of a SiN-based or SiON-based inorganic material.

A light blocking wall may be formed in a boundary portion between the phase difference pixel and the imaging pixel in the planarization film.

A space on a light receiving surface side may be sealed with a sealing glass and a sealing resin.

A planarization film with a lower refractive index than the first and second microlenses may be further formed on the second microlens, and the space on the planarization film may be sealed with the sealing glass and the sealing resin.

The space on the second microlens may be sealed with the sealing glass and the sealing resin, and a refractive index of the second microlens may be sufficiently higher than a refractive index of the sealing resin.

The second microlens may be formed by a concavity formed on the planarization film being sealed with the sealing resin with a higher refractive index than the planarization film.

The sealing resin may be made of an acrylic-based resin, a silicone-based resin, or an epoxy-based resin.

According to an implementation of the present technology, there is provided a method for manufacturing a solid state imaging device including a plurality of imaging pixels arranged two-dimensionally in a matrix configuration and phase difference detecting pixels arranged scatteredly among the imaging pixels, the method including steps of: forming a first microlens for each of the imaging pixels; forming a planarization film with a lower refractive index than the first microlens on the first microlens; and forming a second microlens only on the planarization film of the phase difference detecting pixel.

According to an implementation of the present technology, there is provided an electronic device including: a solid state imaging device including a plurality of imaging pixels arranged two-dimensionally in a matrix configuration and phase difference detecting pixels arranged scatteredly among the imaging pixels, the solid state imaging device including a first microlens formed for each of the imaging pixels, a planarization film having a lower refractive index than the first microlens and formed on the first microlens, and a second microlens formed only on the planarization film of the phase difference detecting pixel; a signal processing circuit configured to process an output signal outputted from the solid state imaging device; and a lens configured to cause incident light to be incident on the solid state imaging device.

The signal processing circuit may correct shading occurring in the imaging pixel placed near the phase difference detecting pixel.

The signal processing circuit may correct the shading using a shading function found beforehand which expresses a degree of shading corresponding to the placement of the imaging pixel that is a target of the shading correction.

The shading function may be found in accordance with a lens parameter of the lens portion.

The signal processing circuit may correct the shading using an output of the imaging pixel of same color nearest to the imaging pixel that is a target of the shading correction.

In an implementation of the present technology, in a solid state imaging device including a plurality of imaging pixels two-dimensionally arranged in a matrix configuration and phase difference detecting pixels arranged scatteredly among imaging pixels, a first microlens is formed for each imaging pixel, a planarization film with a lower refractive index than the first microlens is formed on the first microlens, and a second microlens is formed only on the planarization film of the phase difference detecting pixel.

Advantageous Effects of Invention

According to an implementation of the present invention, it becomes possible to make good both the oblique incident light characteristics of an imaging pixel and the AF characteristics of a phase difference detecting pixel.

DESCRIPTION OF EMBODIMENTS

Hereinbelow, embodiments of the present technology are described with reference to the drawings. The description is given in the following order:

1. Schematic configuration example of a solid state imaging device

2. First embodiment (an example of the basic solid state imaging device of the present technology)

3. Second embodiment (an example of the solid state imaging device including a light blocking wall at a pixel boundary)

4. Third embodiment (an example of the solid state imaging device of a cavity-less CSP structure)

5. Fourth embodiment (an example of the electronic device including the solid state imaging device of the present technology)

1. Schematic Configuration Example of a Solid State Imaging Device

Figure 1:
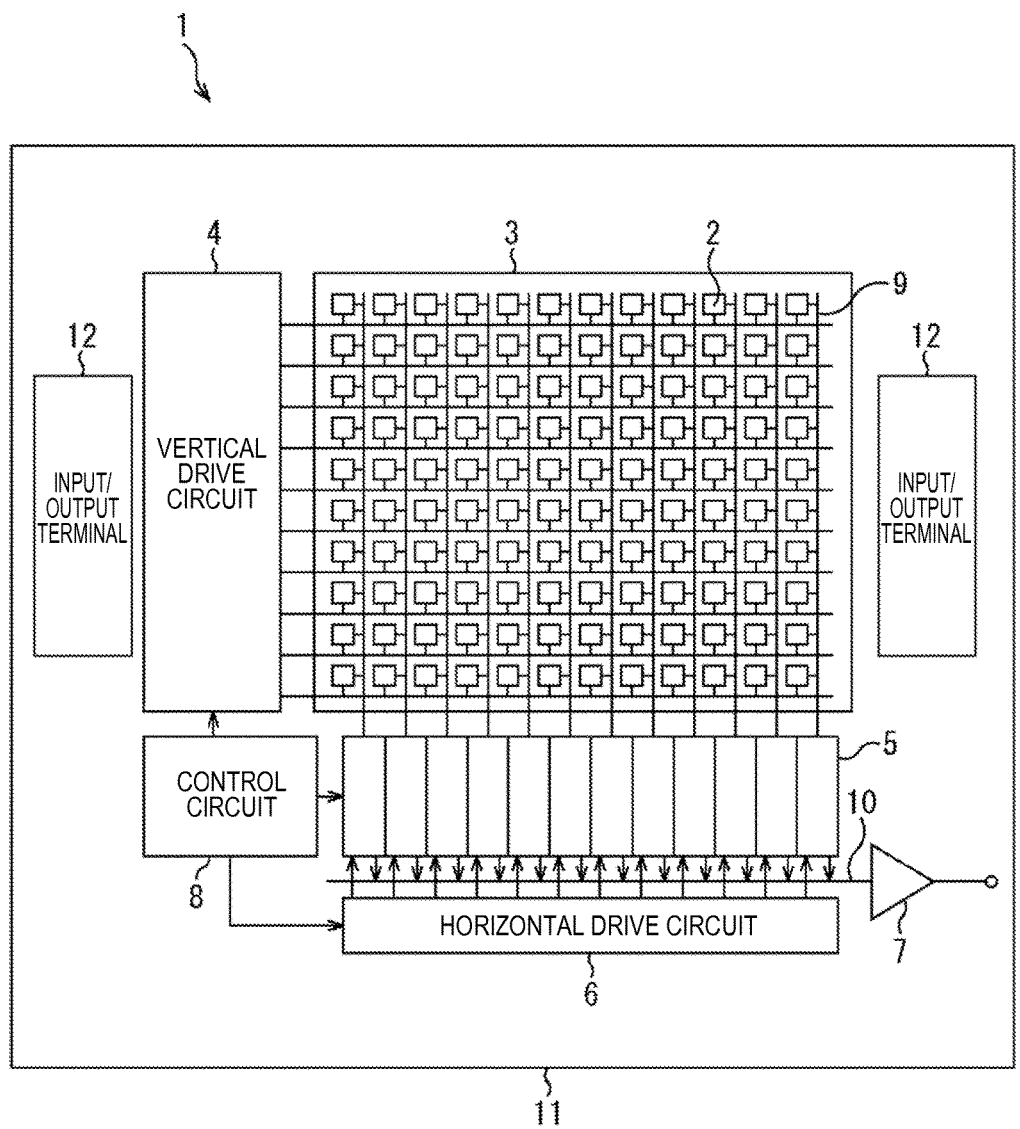
FIG. 1 is a block diagram showing a schematic configuration example of a solid state imaging device to which the present technology is applied.

FIG. 1 shows a schematic configuration example of a complementary metal oxide semiconductor (CMOS) solid state imaging device used in each embodiment of the present technology.

As shown in FIG. 1, a solid state imaging device 1 is configured to include a pixel region (what is called an imaging region) 3 in which a plurality of pixels 2 including a photoelectric conversion element are arranged regularly and two-dimensionally on a semiconductor substrate 11 (e.g. a silicon substrate) and a peripheral circuit unit.

The pixel 2 includes a photoelectric conversion element (e.g. a photodiode) and a plurality of pixel transistors (what is called MOS transistors). The plurality of pixel transistors may be composed of, for example, three transistors of a transfer transistor, a reset transistor, and an amplifier transistor, or may be composed of four transistors further including a select transistor. An equivalent circuit of each pixel 2 (unit pixel) is similar to an ordinary one, and herein a detailed description is omitted.

The pixel 2 may be a shared pixel structure. The pixel shared structure is composed of a plurality of photodiodes, a plurality of transfer transistors, one shared floating diffusion, and other shared one-by-one pixel transistors.

The peripheral circuit unit is composed of a vertical drive circuit 4, a column signal processing circuit 5, a horizontal drive circuit 6, an output circuit 7, and a control circuit 8.

The control circuit 8 receives an input clock or data of ordering the operating mode etc., and outputs data of internal information etc. of the solid state imaging device 1. Specifically, the control circuit 8 produces a clock signal or a control signal serving as a standard of the operation of the vertical drive circuit 4, the column signal processing circuit 5, and the horizontal drive circuit 6 on the basis of a vertical synchronizing signal, a horizontal synchronizing signal, and a master clock. Then, the control circuit 8 inputs these signals to the vertical drive circuit 4, the column signal processing circuit 5, and the horizontal drive circuit 6.

The vertical drive circuit 4 is formed of, for example, a shift resistor; and selects a pixel drive interconnection and supplies a pulse for driving the pixel 2 to the selected pixel drive interconnection to drive pixels 2 on a row basis. Specifically, the vertical drive circuit 4 selectively scans each pixel 2 in the pixel region 3 sequentially in the vertical direction on a row basis, and supplies the column signal processing circuit 5 with, via a vertical signal line 9, a pixel signal based on a signal charge generated in accordance with the received light quantity in the photoelectric conversion element in each pixel 2.

The column signal processing circuit 5 is disposed for each column of pixels 2, for example, and performs signal processing such as denoising on the signal outputted from the pixel 2 of one row for each pixel column. Specifically, the column signal processing circuit 5 performs signal processing such as correlated double sampling (CDS) for removing fixed pattern noise peculiar to the pixel 2, signal amplification, or analog/digital (A/D) conversion. The output stage of the column signal processing circuit 5 is provided with a horizontal select switch (not shown) that is connected between the output stage and a horizontal signal line 10.

The horizontal drive circuit 6 is formed of, for example, a shift resistor; and sequentially selects each of the column signal processing circuits 5 by sequentially outputting a horizontal scan pulse, and causes a pixel signal to be outputted from each of the column signal processing circuits 5 to the horizontal signal line 10.

The output circuit 7 performs signal processing on the signal sequentially supplied from each of the column signal processing circuits 5 via the horizontal signal line 10, and outputs the processed signal. The output circuit 7 may perform only buffering or may perform black level adjustment, column variation correction, various digital signal processings, etc., for example.

Input/output terminals 12 are provided to exchange signals with the outside.

2. First Embodiment

[Configuration of the Solid State Imaging Device]

Figure 2:
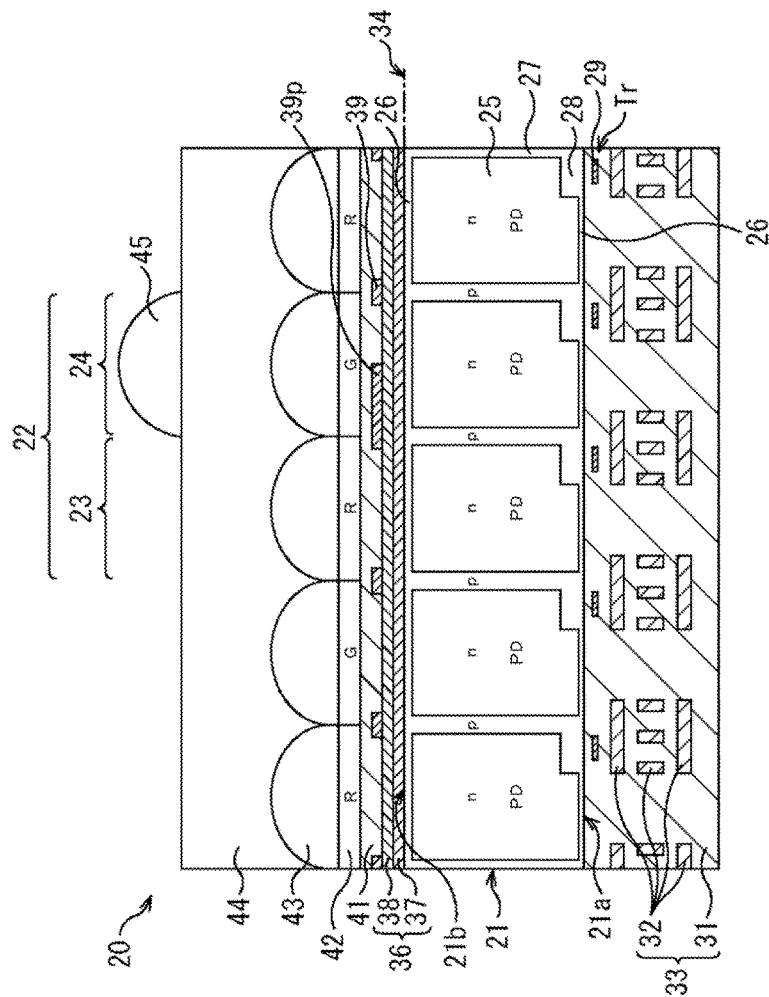
FIG. 2 is a cross-sectional view showing an example of the configuration of a solid state imaging device of a first embodiment of the present technology.

FIG. 2 shows an example of the configuration of a first embodiment of the solid state imaging device of the present technology. The solid state imaging device of each embodiment of the present technology is configured as a back-side illumination CMOS solid state imaging device.

In a solid state imaging device 20 of the first embodiment, a pixel region (what is called an imaging region) in which a plurality of pixels are arranged and a peripheral circuit unit (not shown) disposed around the pixel region are formed on a semiconductor substrate 21 made of, for example, silicon.

A unit pixel 22 (hereinafter referred to simply as a pixel 22) is composed of a photodiode PD that is a photoelectric conversion unit and a plurality of pixel transistors Tr. The photodiode PD is formed in the entire region in the thickness direction of the semiconductor substrate 21, and is configured as a p-n junction photodiode formed of a semiconductor region 25 of a first conductivity type (in this example, the n type) and a semiconductor region 26 of a second conductivity type (in this example, the p type) facing both the front and back surfaces of the substrate. The p-type semiconductor region facing both the front and back surfaces of the substrate serves also as a hole charge storage region for suppressing the dark current.

The pixel 22 composed of the photodiode PD and the pixel transistors Tr is categorized into an imaging pixel 23 that produces a signal for producing an image on the basis of subject light received and a phase difference detecting pixel 24 that produces a signal for performing phase difference detection auto-focus (AF) (phase difference AF).

Phase difference detecting pixels 24 are arranged scatteredly among a plurality of imaging pixels 23 arranged two-dimensionally in a matrix configuration. Specifically, prescribed part of the plurality of imaging pixels 23 arranged two-dimensionally in a matrix configuration are replaced, and thereby the phase difference detecting pixels 24 are arranged regularly in a specific pattern.

Each of the pixels 22 (the imaging pixel 23 and the phase difference detecting pixel 24) is separated by an element isolation region 27. The element isolation region 27 is formed of a p-type semiconductor region, and is grounded, for example. The pixel transistor Tr is formed by forming a not-shown n-type source region and a not-shown n-type drain region in a p-type semiconductor well region 28 formed on the substrate front surface 21a side of the semiconductor substrate 21 and forming a gate electrode 29 on the substrate front surface between the source region and the drain region via a gate insulating film. In FIG. 2, a plurality of pixel transistors are shown representatively by one pixel transistor Tr and schematically shown by the gate electrode 29.

On the substrate front surface 21a of the semiconductor substrate 21, what is called a multilayer interconnection layer 33 in which a plural layers of interconnections 32 are arranged via an interlayer insulating film 31 is formed. Since light is not incident on the multilayer interconnection layer 33 side, the layout of the interconnection 32 is freely set.

An insulating layer is formed on the substrate back surface 21b serving as a light receiving surface 34 of the photodiode PD. The insulating layer is formed of an anti-reflection film 36 in this example. The anti-reflection film 36 is formed of a plurality of films with different refractive indices and is, in this example, formed of two films of a hafnium oxide ($HfO_2$) film 38 and a silicon oxide film 37.

A light blocking film 39 is formed at the pixel boundary on the anti-reflection film 36. The light blocking film 39 needs only to be a material that blocks light, and is preferably formed of a film of a metal, such as aluminum (Al), tungsten (W), or copper (Co), as a material that has strong light blocking effect and can be processed by microprocessing, such as etching, with good accuracy.

Figure 3:
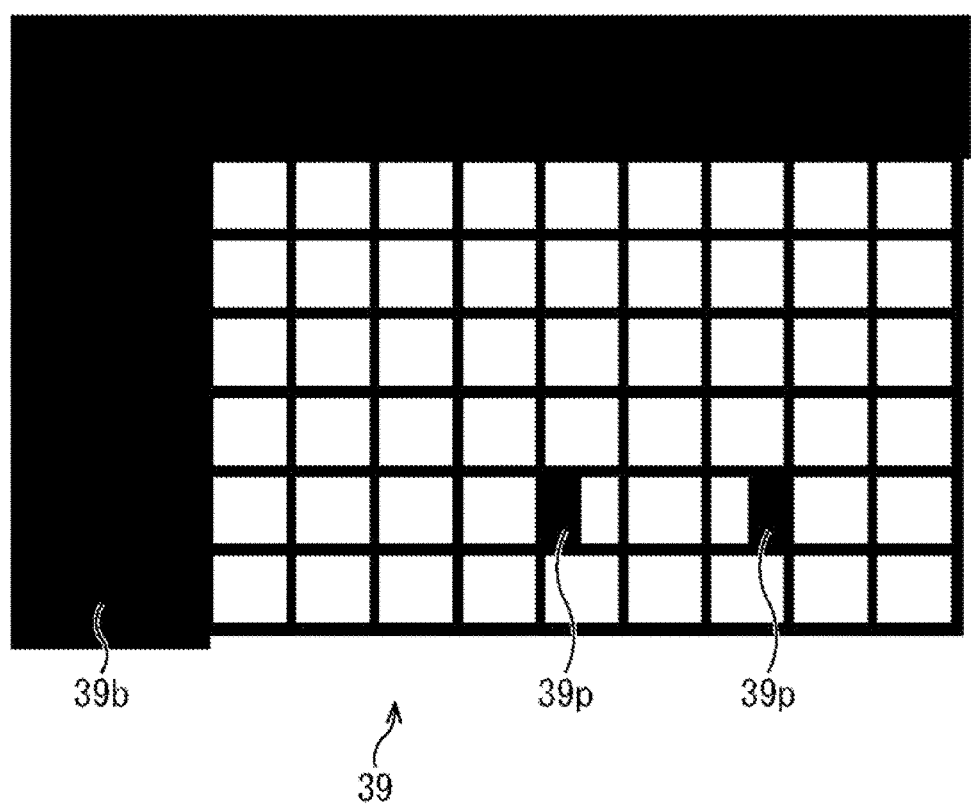
FIG. 3 is a view showing an example of the configuration of a light blocking film.

The light blocking film 39 has, as its partial planar configuration, a configuration like that shown in FIG. 3. As shown in FIG. 3, the light blocking film 39 has a lattice-like region that suppresses flares caused by color mixing of pixels at the pixel boundary or light with a large incident angle. The light blocking film 39 further has an optical black (OPB) clamp region 39b covering the outside of the pixel region and serving to detect a black level serving as a reference of the dark time output and a separation portion 39p for separating light from different exit pupils in the phase difference detecting pixel 24.

As shown in FIG. 2, in the phase difference detecting pixel 24, the left half of the photodiode PD is shielded from light by the separation portion 39p.

These regions in the light blocking film 39 do not need to be formed simultaneously but may be formed separately. When, for example, it is attempted to improve sensitivity more preferentially than to suppress color mixing and flares, the width of the lattice-like region may be made smaller.

A planarization film 41 is formed on the anti-reflection film 36 including the light blocking film 39, and a color filter 42 is formed on the planarization film 41 for each pixel 22.

The planarization film 41 is formed by, for example, applying an organic material such as a resin by spin coating. The planarization film 41 is formed in order to avoid non-uniformity occurring in a spin coating process during forming the color filter 42; but when the non-uniformity is within the permissible range, the planarization film 41 may not be formed. The planarization film 41 may be formed also by, for example, forming an inorganic film of $SiO_2$ or the like and performing planarization by chemical mechanical polishing (CMP).

The color filter 42 is formed by, for example, applying a pigment or a dye by spin coating. As the color filter 42, for example, a color filter of the Bayer arrangement is used, but color filters of other arrangements may be used.

A microlens 43 is formed on the color filter 42 for each pixel 22.

The microlens 43 is formed of a material with a refractive index of 1.4 or more, and is formed of, for example, an organic material such as a styrene-based resin, an acrylic-based resin, a styrene-acrylic copolymer-based resin, or a siloxane-based resin. The refractive index of styrene-based resins is set to approximately 1.6, the refractive index of acrylic-based resins is set to approximately 1.5, the refractive index of styrene-acrylic copolymer-based resins is set to approximately 1.5 to 1.6, and the refractive index of siloxane-based resins is set to approximately 1.45.

The microlens 43 may be formed also of an organic-inorganic hybrid material in which TiO fine particles are dispersed in the styrene-based resin, acrylic-based resin, styrene-acrylic copolymer-based resin, or siloxane-based resin mentioned above or a polyimide resin.

The microlens 43 may be formed also of a SiN-based or SiON-based inorganic material. The refractive index of SiN is set to approximately 1.9 to 2.0 and the refractive index of SiON is set to approximately 1.45 to 1.9.

A low n planarization film 44 is formed on the microlens 43. Herein, "low n" means a low refractive index. The low n planarization film 44 is formed of a material (a material with a refractive index of 1.5 or less) with a lower refractive index than the microlens 43, and is formed by, for example, fluorine or hollow silica being added to an acrylic-based resin or a siloxane-based resin. In this case, the refractive index of the low n planarization film 44 is set to approximately 1.2 to 1.45.

The low n planarization film 44 may be formed also by, for example, forming an inorganic film of $SiO_2$ or the like and performing planarization by CMP. In this case, the refractive index of the low n planarization film 44 is set to approximately 1.45.

An on-layer microlens 45 is formed only on the low n planarization film 44 of the phase difference detecting pixel 24. The on-layer microlens 45 is formed of a material with a refractive index of 1.4 or more similarly to the microlens 43, and is formed of, for example, an organic material such as a styrene-based resin, an acrylic-based resin, a styrene-acrylic copolymer-based resin, or a siloxane-based resin. The on-layer microlens 45 may be formed also of an organic-inorganic hybrid material in which TiO fine particles are dispersed in these organic materials or a polyimide resin, or may be formed of a SiN-based or SiON-based inorganic material.

[Flow of the Manufacturing Processing of the Solid State Imaging Device]

Figure 4:
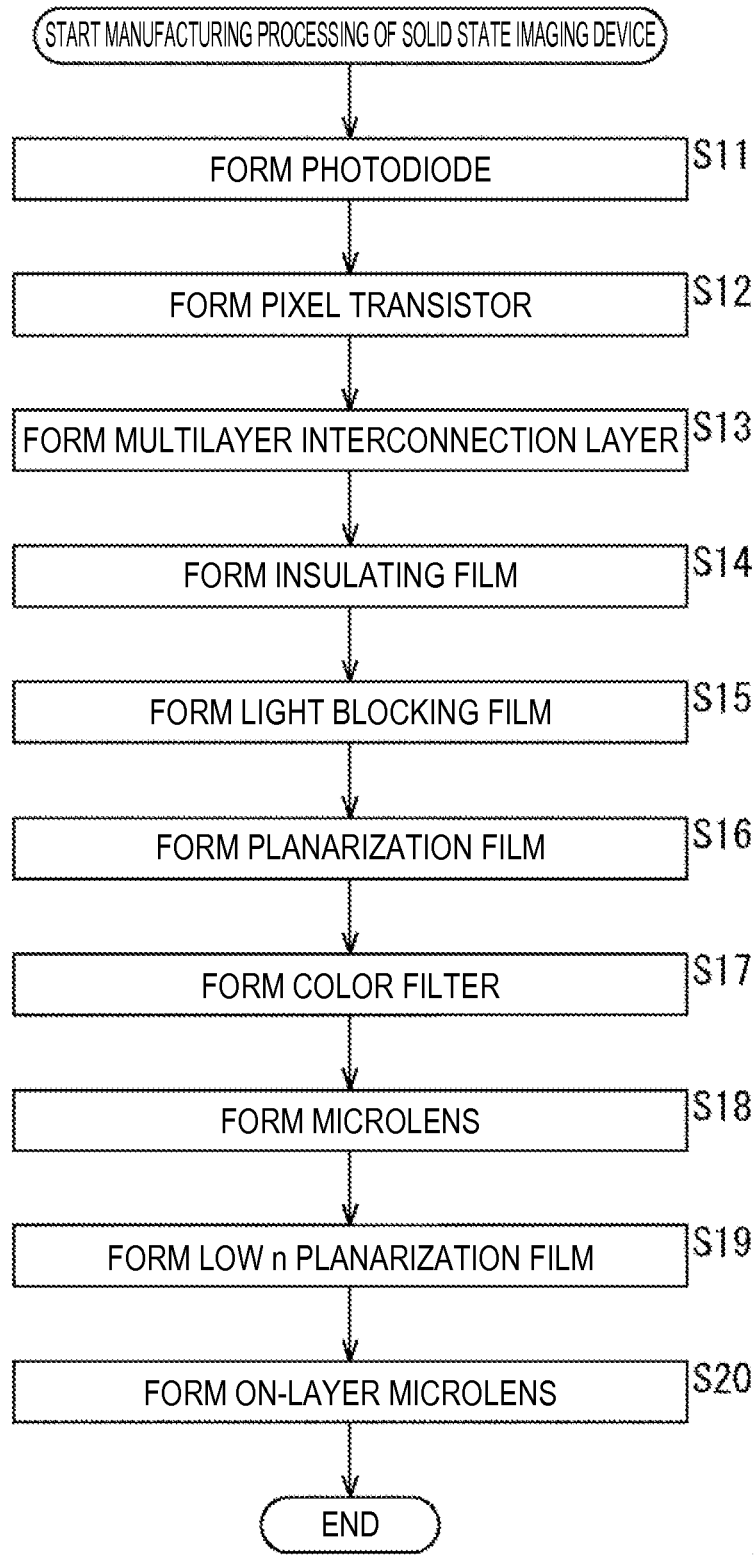
FIG. 4 is a flow chart describing the manufacturing processing of the solid state imaging device of FIG. 2.
Figure 5:
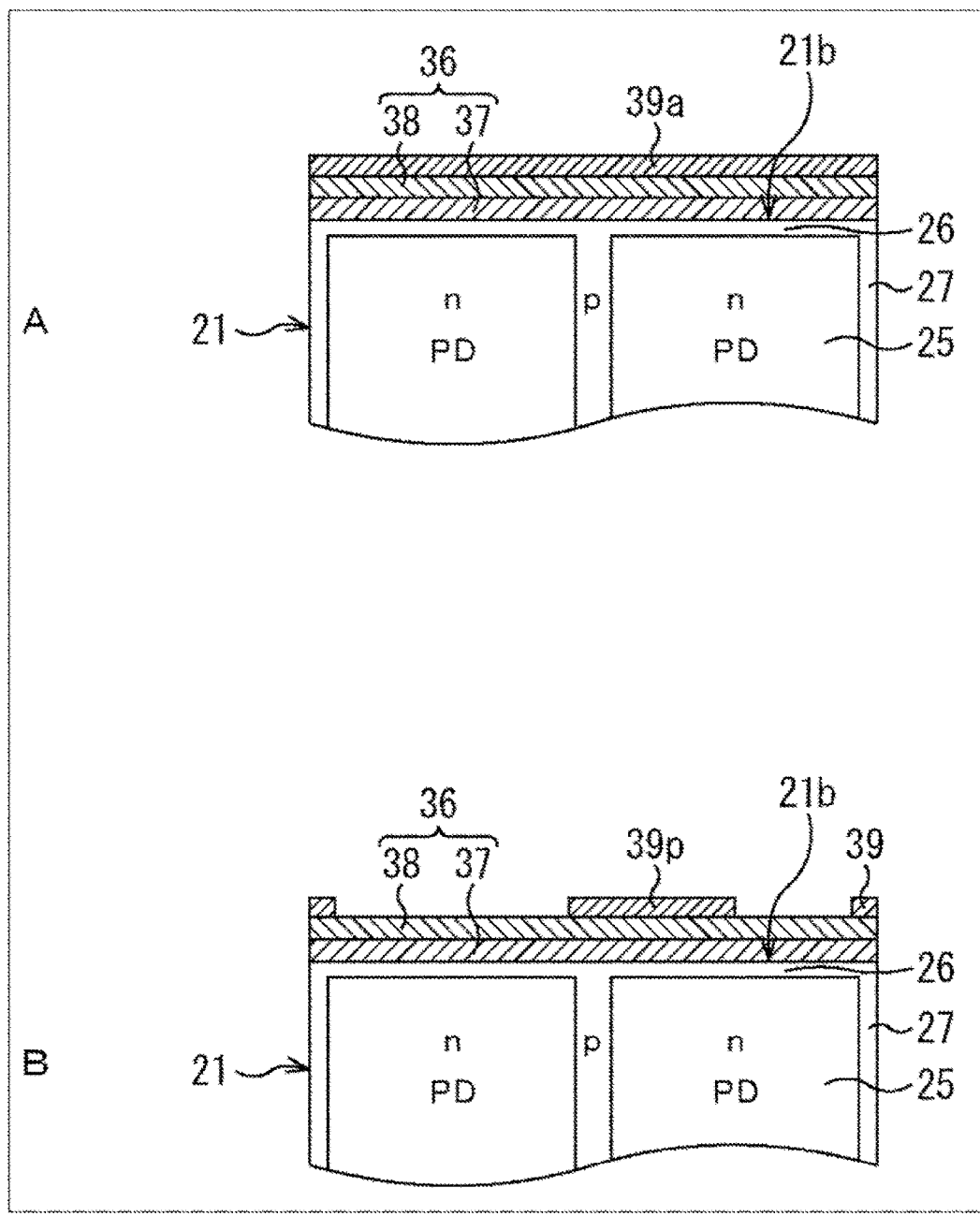
FIG. 5 is views describing the manufacturing process of a solid state imaging device.
Figure 6:
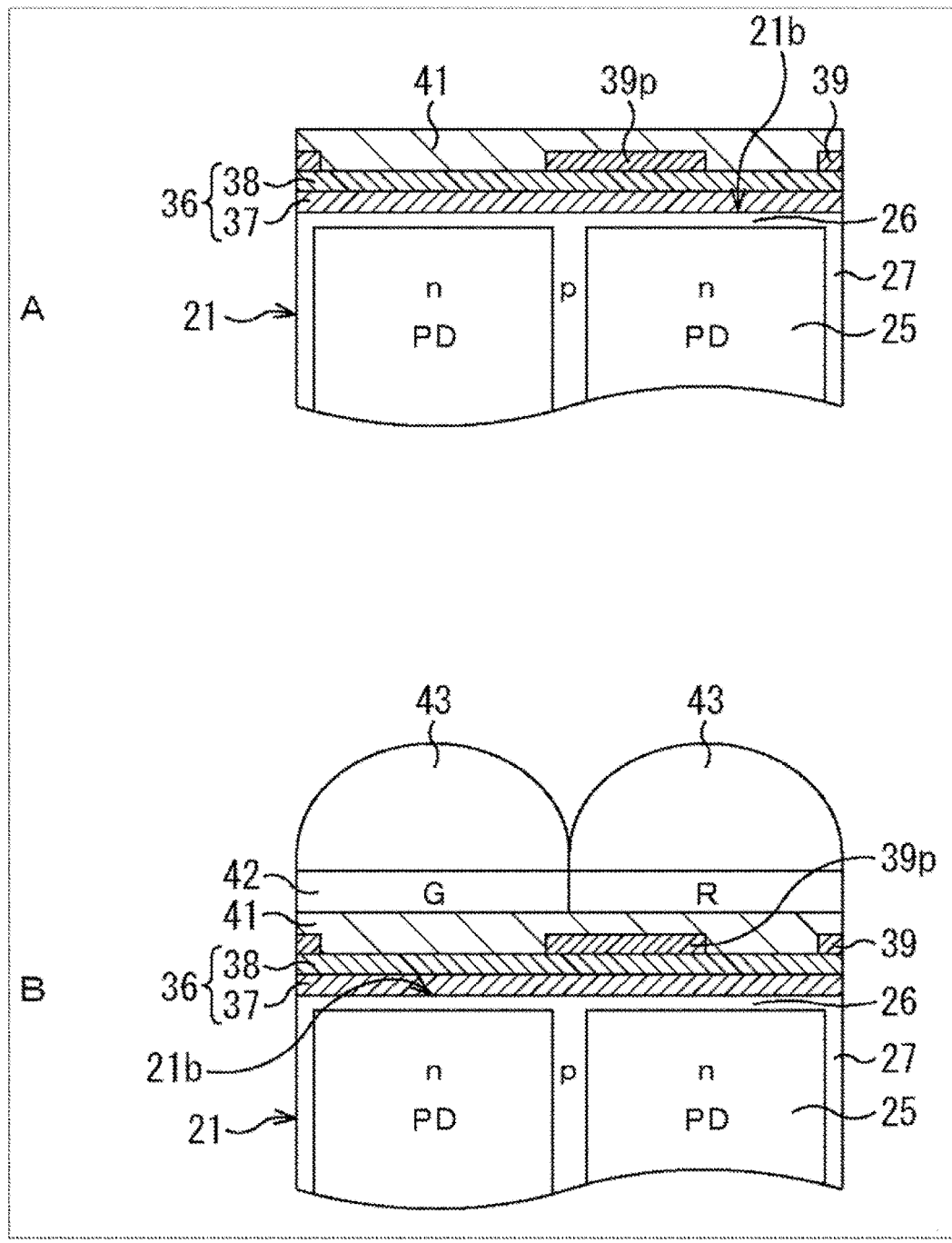
FIG. 6 is views describing the manufacturing process of the solid state imaging device.
Figure 7:
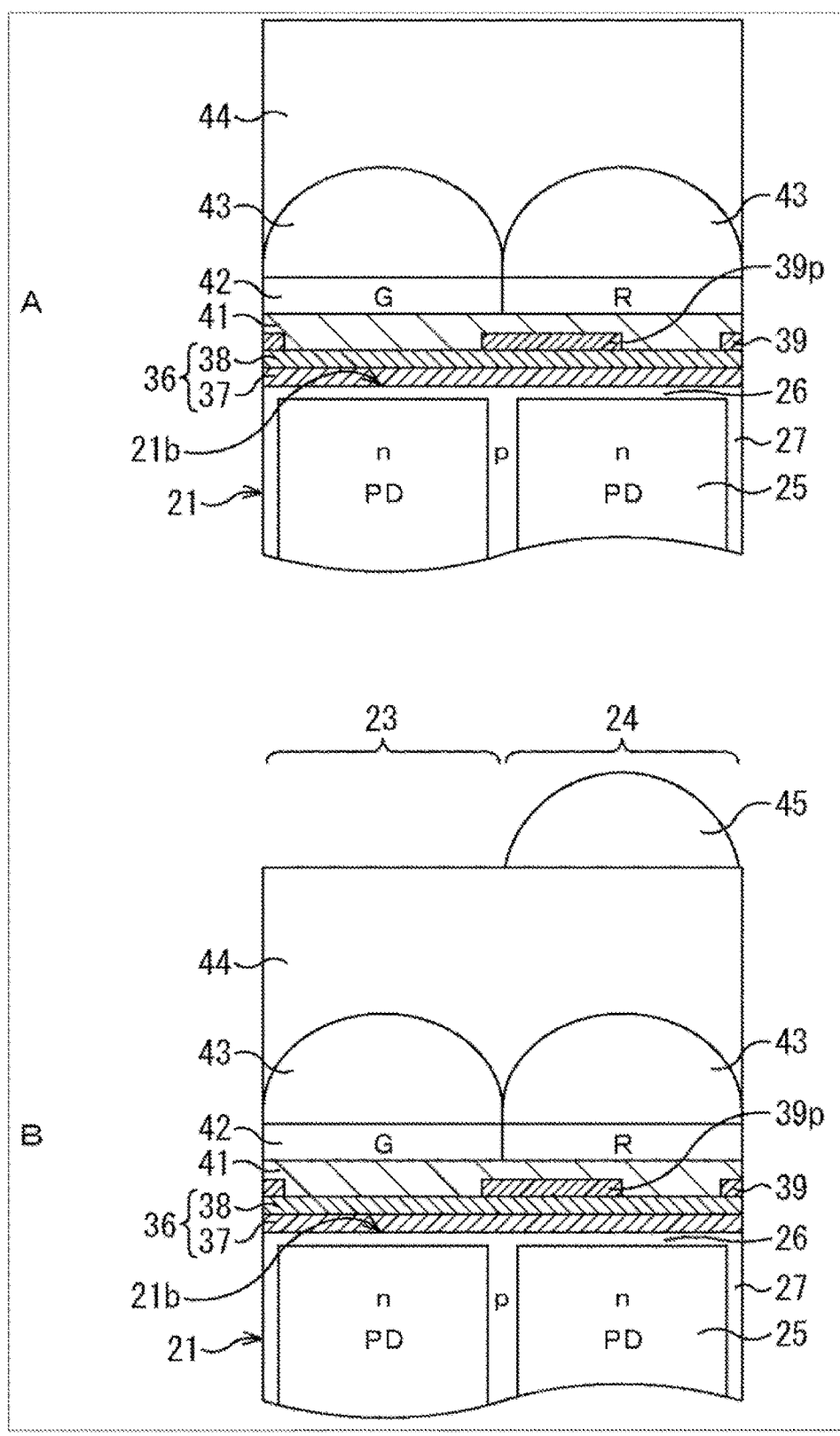
FIG. 7 is views describing the manufacturing process of the solid state imaging device.

Next, the manufacturing processing of the solid state imaging device 20 of FIG. 2 is described with reference to FIG. 4 to FIG. 7. FIG. 4 is a flow chart describing the manufacturing processing of the solid state imaging device 20, and FIG. 5 to FIG. 7 show cross-sectional views of the solid state imaging device 20 in the manufacturing process.

First, in step S11, the photodiode PD corresponding to each pixel 22 separated by the element isolation region 27 formed of a p-type semiconductor region is formed in a region of the semiconductor substrate 21 where the pixel region is to be formed.

In step S12, each of a plurality of pixel transistors Tr is formed in the p-type semiconductor well region 28 formed in a region of the substrate front surface 21a corresponding to each pixel 22.

In step S13, the multilayer interconnection layer 33 in which a plural layers of interconnections 32 are arranged is formed on the substrate front surface 21a via the interlayer insulating film 31.

In step S14, as shown in A of FIG. 5, the anti-reflection film 36 is formed on the substrate back surface 21b serving as a light receiving surface, and a light blocking film material layer 39a is formed on the anti-reflection film 36.

In step S15, a resist mask is formed selectively on the light blocking film material layer 39a by lithography. The resist mask is formed in a configuration like that shown in FIG. 3. As shown in B of FIG. 5, the light blocking film material layer 39a is selectively removed by etching via the resist mask to form the light blocking film 39. Wet etching or dry etching may be used as the etching. When dry etching is used, a fine line width of the light blocking film 39 will be obtained with good accuracy.

In step S16, as shown in A of FIG. 6, the planarization film 41 is formed on the anti-reflection film 36 including the light blocking film 39.

In step S17, the color filter 42 of, for example, the Bayer arrangement is formed on the planarization film 41 for each pixel 22.

In step S18, as shown in B of FIG. 6, the microlens 43 is formed on the color filter 42 for each pixel 22. Specifically, a photoresist, such as a photosensitive material containing a novolak resin as a main component, is patterned by lithography. Heat treatment of a higher temperature than the thermal softening point is performed on the patterned photoresist to form a lens shape. The photoresist formed in a lens shape is used as a mask to perform dry etching to pattern-transfer the lens shape to a lens material forming an underlayer; thus, the microlens 43 is formed for all the pixels 22.

In step S19, as shown in A of FIG. 7, the low n planarization film 44 is formed on the microlens 43.

In step S20, as shown in B of FIG. 7, the on-layer microlens 45 is formed only on the low n planarization film 44 of the phase difference detecting pixel 24. The on-layer microlens 45 is formed by a method similar to the method for forming the microlens 43 in step S17.

The formation of the microlens 43 and the on-layer microlens 45 is not limited to the method described above, and a method may be used in which, for example, a lens material made of a photosensitive resin is formed into a film; the processings of pre-baking, light exposure, development, and bleaching exposure are sequentially performed; and then heat treatment of a higher temperature than the thermal softening point of the lens material is performed.

In the above processes, the layer thickness of the whole solid state imaging device 20 and the curvature of the microlens are adjusted so that the light collection point is on the light blocking film 39 in order to improve the separability of the phase difference detecting pixel 24.

The layer thickness of the whole solid state imaging device 20 is adjusted by, for example, the film thickness of the low n planarization film 44, the film thickness of the lens material of the microlens 43 and the on-layer microlens 45, and the etching amount of the lens material.

The curvature of the microlens is adjusted by the resist film thickness in lithography and reflow during lens formation, dry etching conditions (gas type, processing time, power, etc.), etc. The microlens 43 and the on-layer microlens 45 are formed in such a lens shape that the curvature is uniform as seen from all directions so that the light collection points coincide. Specifically, the microlens 43 and the on-layer microlens 45 with such a lens shape that the curvature is uniform as seen from all directions are formed by finding a shape (quadrangle, octagon, or circle) and dimensions of the reticle for lithography, a reflow temperature, and etching conditions suitable for the pixel size.

Here, in the configuration disclosed in Patent Literature 2 in which a level difference is provided for the microlens of the phase difference detecting pixel, supposing that, for example, the level difference is formed earlier than the microlens, there is a concern that in lithography for lens formation, non-uniformity due to the level difference will occur during resist application, or the focus control in lithography over different heights will not be easy; thus, the lens shape will collapse. Further, supposing that the level difference is formed later than the microlens, although it may be possible to mask the phase difference detecting pixel with a resist and etch the imaging pixel to reduce its height, there is a concern that the lens shape will collapse due to excessive etching.

Furthermore, when consideration is given to the assembly process of the configuration disclosed in Patent Literature 2, there is a concern that a BGR tape cannot be attached due to the level difference, or the structure provided with a level difference will be damaged when the tape is peeled off.

There is also a concern that light reflected at a wall portion formed by the level difference due to the difference in refractive index with air will affect an adjacent pixel.

Thus, in the configuration disclosed in Patent Literature 2, it is difficult to solve the trade-off in which reducing the height of the imaging pixel and increasing the height of the phase difference detecting pixel are required in a back-side illumination solid state imaging device including an imaging element and a phase difference detecting pixel.

On the other hand, in the above processing, there is no concern that non-uniformity will occur in lithography for lens formation and no concern that the lens shape will collapse due to defocusing in lithography or excessive etching, and there is no influence on adjacent pixels because a wall portion resulting from a level difference is not formed; thus, a configuration that solves the trade-off in which reducing the height of the imaging pixel and increasing the height of the phase difference detecting pixel are required can be obtained, and it becomes possible to make good both the oblique incident light characteristics of the imaging pixel and the AF characteristics of the phase difference detecting pixel.

It is also possible to form an anti-reflection film on the surface of the microlens 43 or the on-layer microlens 45 in order to suppress reflection at the interface between different refractive indices, specifically at the interface between the microlens 43 and the low n planarization film 44 and the interface between the on-layer microlens 45 and air.

Specifically, an oxide film is formed conformally on the surface of the on-layer microlens 45, or SiON is formed conformally on the surface of the microlens 43. The film thickness of the anti-reflection film is determined with consideration of the interference of incident light.

Modification examples of the embodiment will now be described.

Modification Example 1

Figure 8:
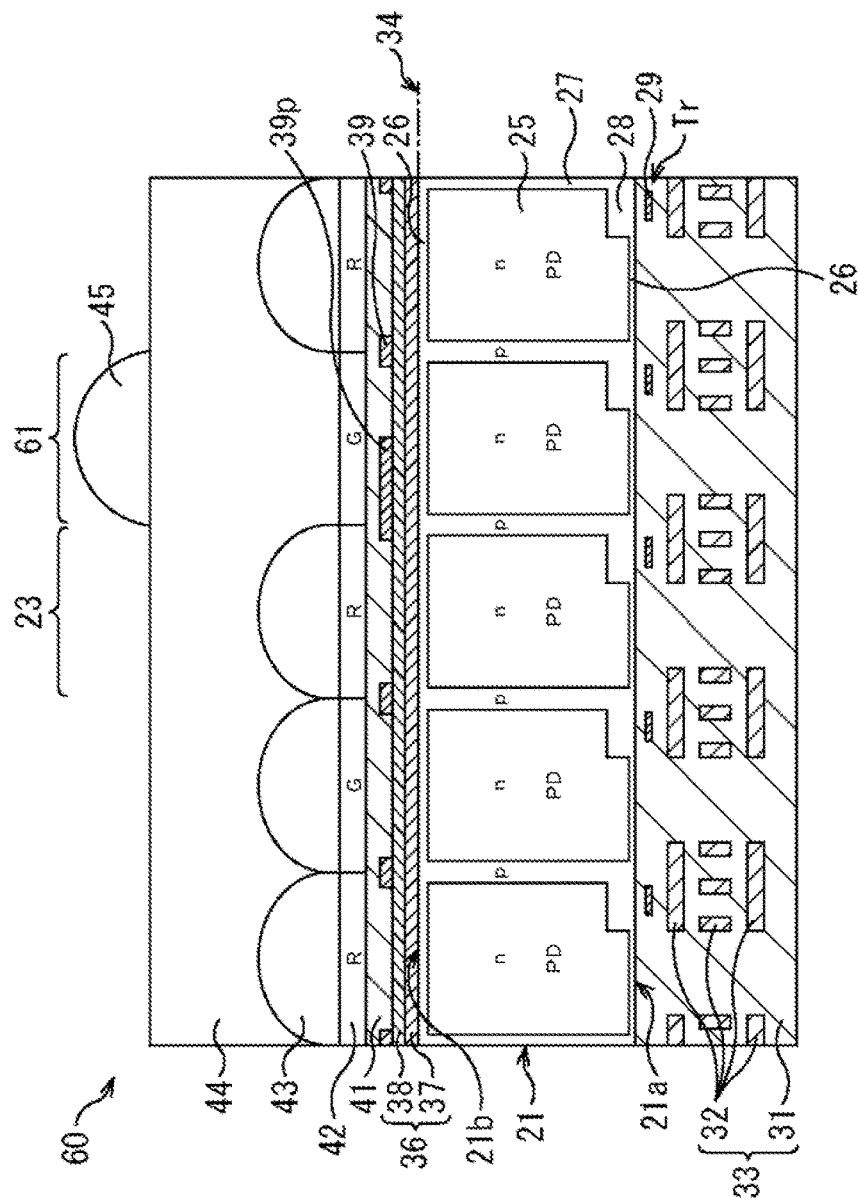
FIG. 8 is a cross-sectional view showing a modification example of the solid state imaging device.

FIG. 8 shows a modification example of the first embodiment of the solid state imaging device of the present technology.

In a solid state imaging device 60 of FIG. 8, components having the same functions as those provided in the solid state imaging device 20 of FIG. 2 are marked with the same names and the same reference numerals, and a description thereof is omitted as appropriate.

The solid state imaging device 60 of FIG. 8 is configured such that the microlens 43 is not formed in a phase difference detecting pixel 61.

In the phase difference detecting pixel, it is required for the light collection point to be on the light blocking film; but in the case of light collection via a plurality of lenses like the phase difference detecting pixel 24 of FIG. 2, the variation in lens formation may influence the light collection characteristics.

In contrast, in the phase difference detecting pixel 61 of FIG. 8, since light is collected only by the on-layer microlens 45, the light collection characteristics are not influenced by the variation in lens formation, and the accuracy of phase difference AF can be improved. Although the phase difference detecting pixel 61 has lower light collecting power than the phase difference detecting pixel 24, this can be improved by increasing the height of the on-layer microlens 45 or increasing the curvature of the on-layer microlens 45. Conversely, the phase difference detecting pixel 24 has higher light collecting power than the phase difference detecting pixel 61, and can therefore reduce the layer thickness of the whole solid state imaging device to a lower level.

Modification Example 2

Figure 9:
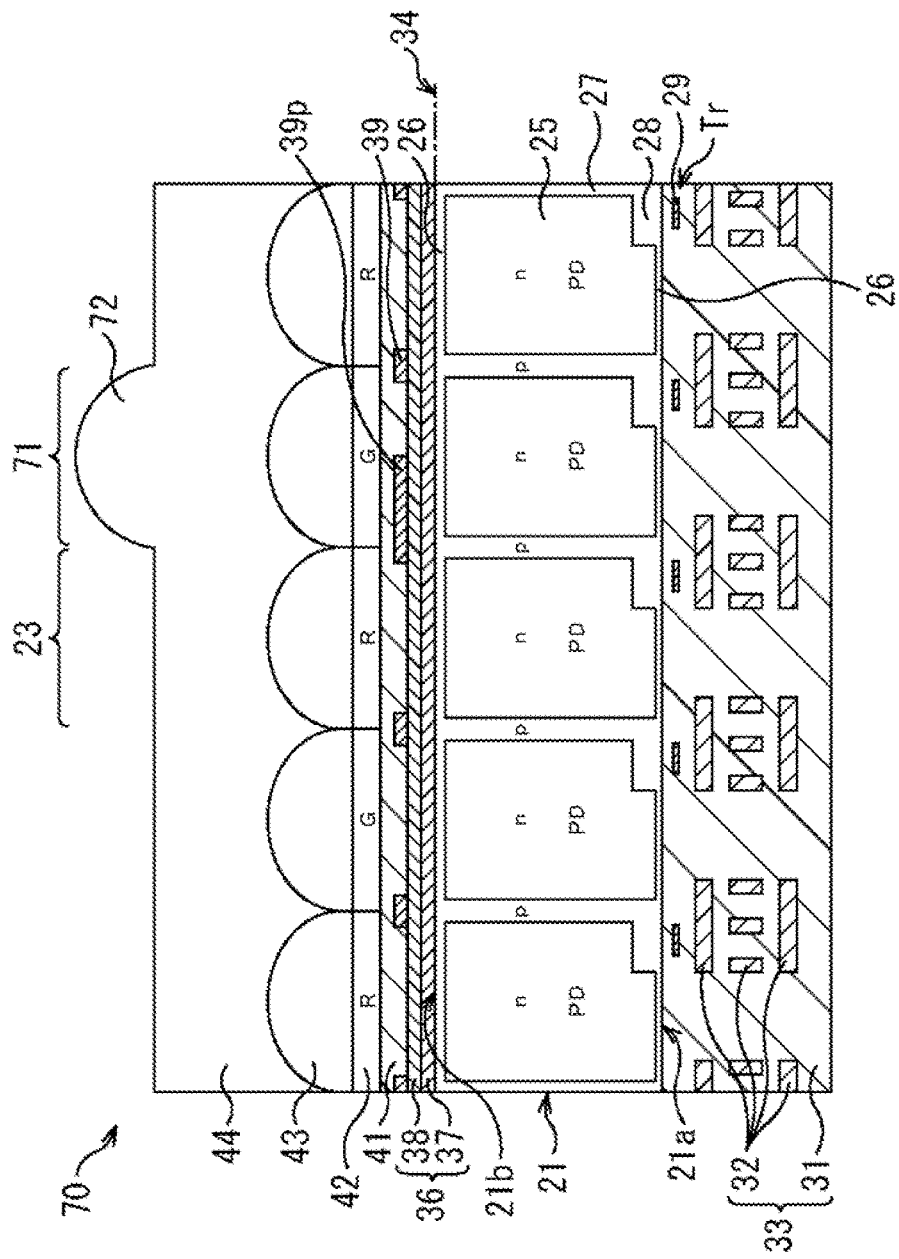
FIG. 9 is a cross-sectional view showing a modification example of the solid state imaging device.

FIG. 9 shows another modification example of the first embodiment of the solid state imaging device of the present technology.

In a solid state imaging device 70 of FIG. 9, components having the same functions as those provided in the solid state imaging device 20 of FIG. 2 are marked with the same names and the same reference numerals, and a description thereof is omitted as appropriate.

The solid state imaging device 70 of FIG. 9 is configured such that an on-layer microlens 72 is formed on the low n planarization film 44 of a phase difference detecting pixel 71.

The on-layer microlens 72 has the same composition as the low n planarization film 44. The on-layer microlens 72 is formed by, in step S20 of the flow chart of FIG. 4, forming a lens shape on the low n planarization film 44 by lithography and reflow and using dry etching to pattern-transfer the lens shape to the low n planarization film 44 forming an underlayer.

By such a configuration, the process of applying the lens material of the on-layer microlens can be omitted.

Modification Example 3

Figure 10:
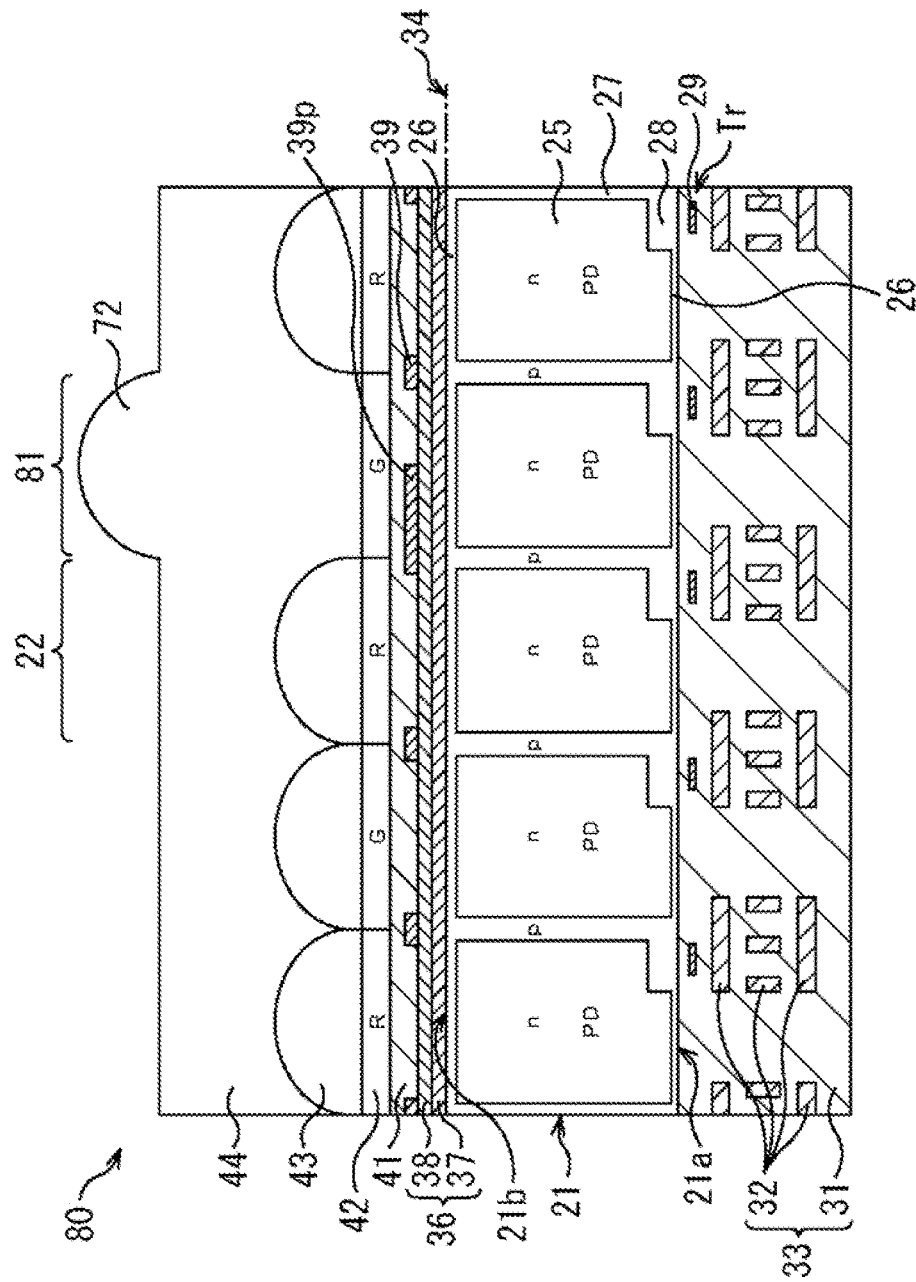
FIG. 10 is a cross-sectional view showing a modification example of the solid state imaging device.

FIG. 10 shows yet another modification example of the first embodiment of the solid state imaging device of the present technology.

In a solid state imaging device 80 of FIG. 10, components having the same functions as those provided in the solid state imaging device 60 of FIG. 8 are marked with the same names and the same reference numerals, and a description thereof is omitted as appropriate.

The solid state imaging device 80 of FIG. 10 is configured such that the on-layer microlens 72 of the same composition as the low n planarization film 44 is formed on the low n planarization film 44 of a phase difference detecting pixel 81 similarly to the solid state imaging device 70 of FIG. 9.

By such a configuration, the accuracy of phase difference AF can be improved, and the process of applying the lens material of the on-layer microlens can be omitted.

3. Second Embodiment

Figure 11:
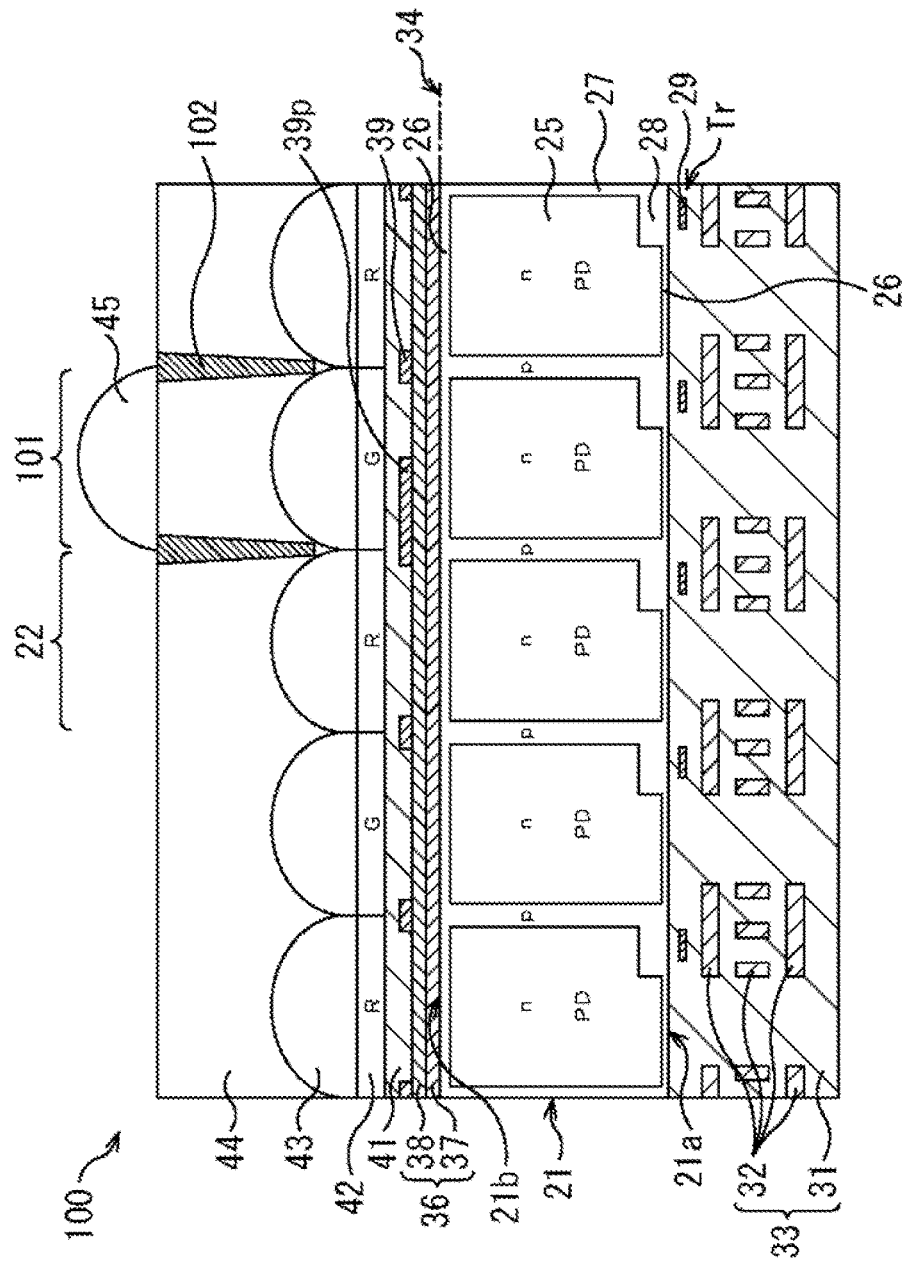
FIG. 11 is a cross-sectional view showing an example of the configuration of a solid state imaging device of a second embodiment of the present technology.

[Configuration of the Solid State Imaging Device]
FIG. 11 shows an example of the configuration of a second embodiment of the solid state imaging device of the present technology.

In a solid state imaging device 100 of FIG. 11, components having the same functions as those provided in the solid state imaging device 20 of FIG. 2 are marked with the same names and the same reference numerals, and a description thereof is omitted as appropriate.

The solid state imaging device 100 of FIG. 11 is configured such that a light blocking wall 102 is formed in a boundary portion between the imaging pixel 23 and a phase difference detecting pixel 101 in the low n planarization film 44.

The light blocking wall 102 is formed by, for example, burying a light blocking material in a trench formed so as to surround the portion of the phase difference detecting pixel 101 in the low n planarization film 44.

[Flow of the Manufacturing Processing of the Solid State Imaging Device]

Next, the manufacturing processing of the solid state imaging device 100 is described with reference to the flow chart of FIG. 12.

Figure 12:
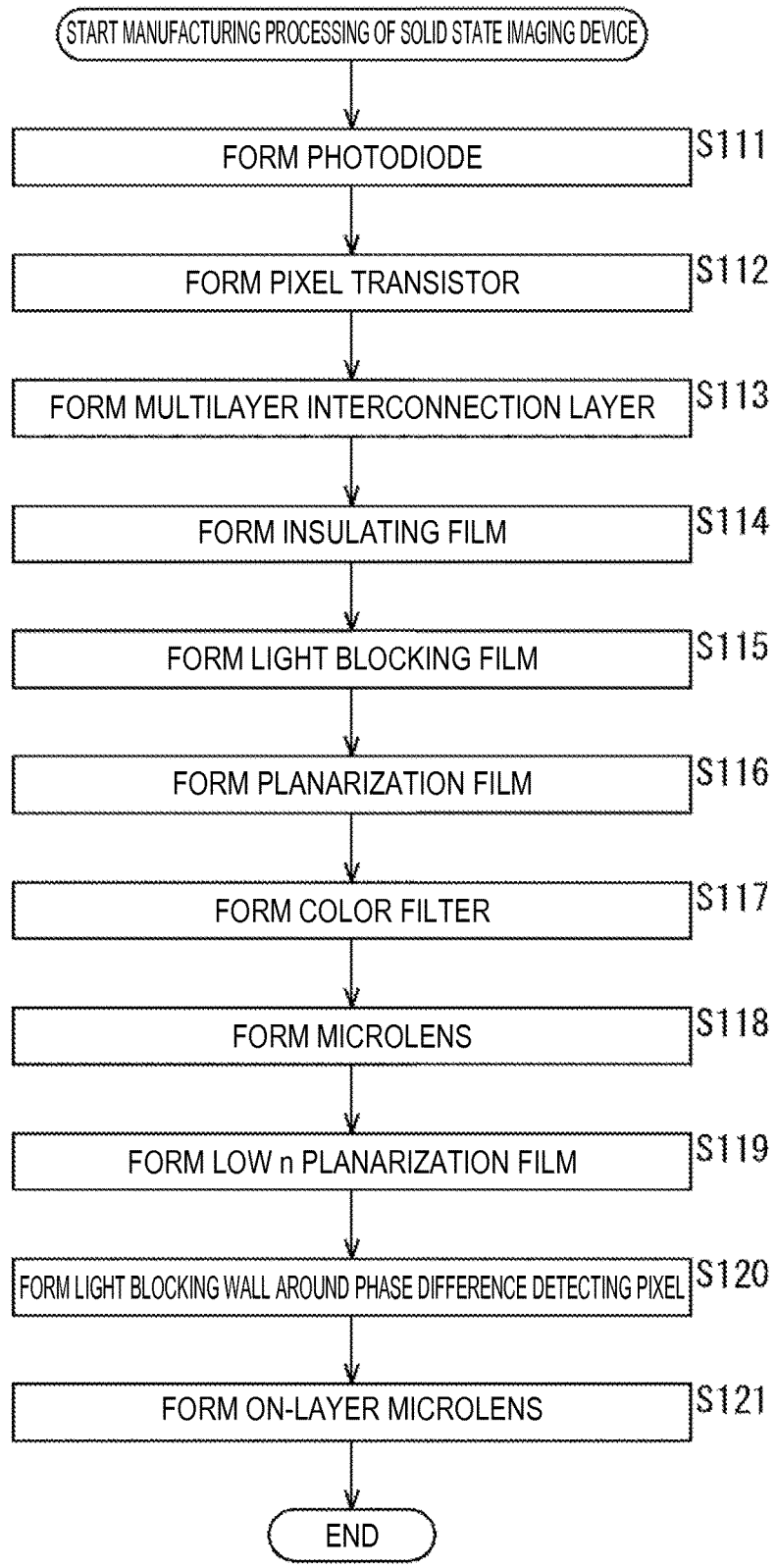
FIG. 12 is a flow chart describing the manufacturing processing of the solid state imaging device of FIG. 11.

The processing of steps S111 to S119 and S121 of the flow chart of FIG. 12 is the same as the processing of steps S11 to S20 of the flow chart of FIG. 4, and a description thereof is omitted.

That is, after the low n planarization film 44 is formed in step S119, the light blocking wall 102 is formed around the phase difference detecting pixel 101 in the low n planarization film 44 in step S120.

Specifically, a trench pattern is formed so as to surround the phase difference detecting pixel 101 in the low n planarization film 44 by lithography, and the trench pattern is transferred to the underlayer using dry etching. It is also possible to form the low n planarization film 44 out of a photosensitive material and perform pattern exposure to form a trench pattern. In this case, the process of dry etching can be omitted.

Then, a light blocking material containing, for example, carbon black is buried in the trench pattern by spin coating, and planarization is performed by etchback; thus, the light blocking wall 102 is formed.

By the above processing, it becomes possible to suppress color mixing from imaging pixels around the phase difference detecting pixel, while obtaining a configuration that solves the trade-off in which reducing the height of the imaging pixel and increasing the height of the phase difference detecting pixel are required in a back-side illumination solid state imaging device including an imaging element and a phase difference detecting pixel.

The solid state imaging device 100 of FIG. 11 may be configured also such that the microlens 43 is not formed in the phase difference detecting pixel 101, or that the on-layer microlens 72 is provided in place of the on-layer microlens 45.

These days, a chip size package (CSP) structure is proposed as a simple package technology for optical sensors such as CMOS solid state imaging devices. However, in the CSP structure, if a space (hereinafter referred to as a cavity) exists between a sealing glass and a chip (optical sensor), there has been a concern that the chip will be warped due to thermal stress upon undergoing a heat process such as reflow.

In view of this, a CSP structure having no cavity by filling the cavity with a resin (hereinafter referred to as a cavity-less CSP structure) is proposed.

Thus, a configuration in which the present technology is applied to a solid state imaging device of a cavity-less CSP structure will now be described. Although a configuration in which the solid state imaging device of the first embodiment is configured to be a cavity-less CSP structure is described in the following, also the solid state imaging device of the second embodiment can be configured to be a cavity-less CSP structure as a matter of course.

4. Third Embodiment

[Configuration of the Solid State Imaging Device]

Figure 13:
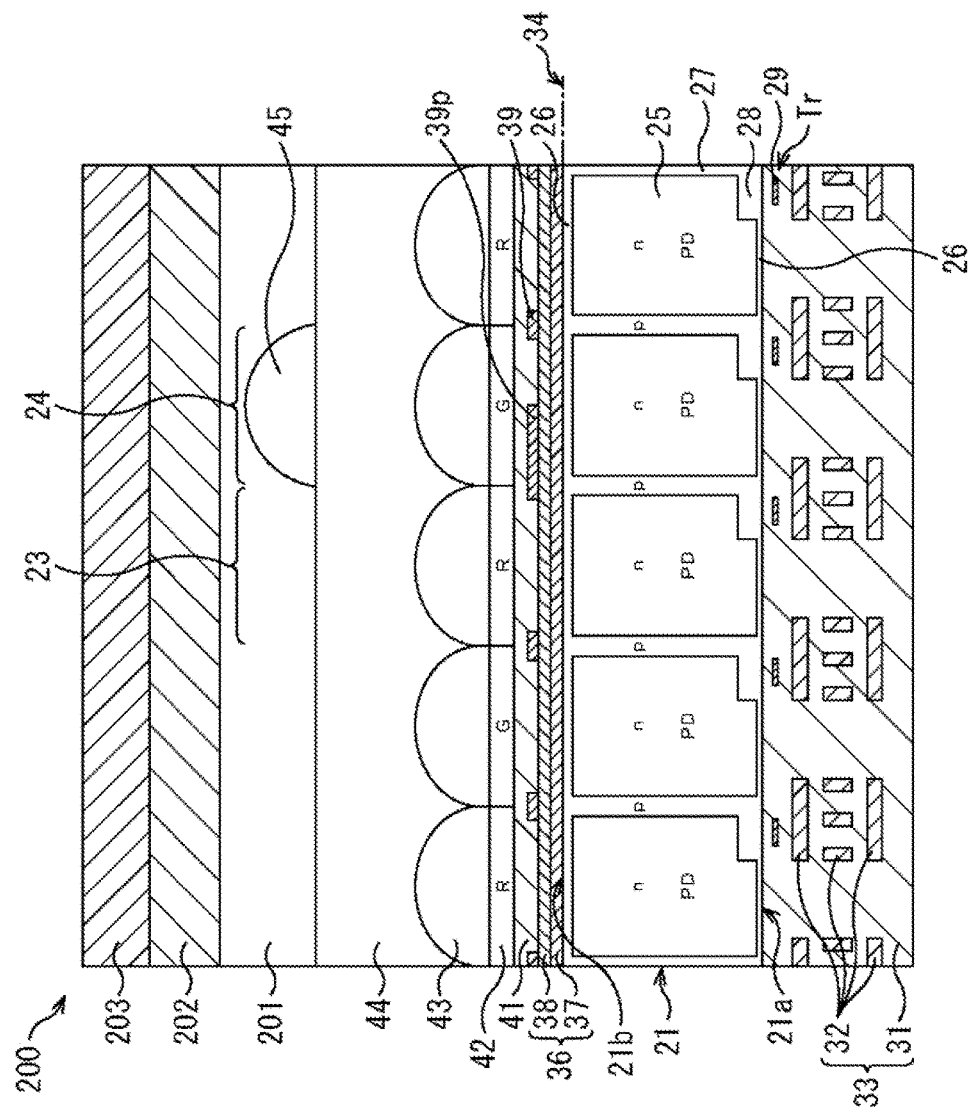
FIG. 13 is a cross-sectional view showing an example of the configuration of a solid state imaging device of a third embodiment of the present technology.

FIG. 13 shows an example of the configuration of a third embodiment of the solid state imaging device of the present technology.

In a solid state imaging device 200 of FIG. 13, components having the same functions as those provided in the solid state imaging device 20 of FIG. 2 are marked with the same names and the same reference numerals, and a description thereof is omitted as appropriate.

In the solid state imaging device 200 of FIG. 13, a low n planarization film 201 is formed on the low n planarization film 44 including the on-layer microlens 45.

Similarly to the low n planarization film 44, the low n planarization film 201 is formed of a material with a lower refractive index than the microlens 43 and the on-layer microlens 45, and is formed by, for example, fluorine or hollow silica being added to an acrylic-based resin or a siloxane-based resin. In this case, the refractive index of the low n planarization film 201 is set to approximately 1.2 to 1.45.

The low n planarization film 201 may be formed also by, for example, forming an inorganic film of $SiO_2$ or the like and performing planarization by CMP. In this case, the refractive index of the low n planarization film 201 is set to approximately 1.45.

The low n planarization film 201 and the low n planarization film 44 may be formed of the same material, or may be formed of different materials.

A sealing resin 202 is formed on the low n planarization film 201. The sealing resin 202 is formed of an acrylic-based resin, a silicone-based resin, an epoxy-based resin, or the like. A sealing glass 203 is formed on the sealing resin 202.

Thus, the solid state imaging device 200 has a cavity-less CSP structure in which the cavity on the light receiving surface side is sealed with the sealing resin 202 and the sealing glass 203.

[Flow of the Manufacturing Processing of the Solid State Imaging Device]

Next, the manufacturing processing of the solid state imaging device 200 is described with reference to the flow chart of FIG. 14.

Figure 14:
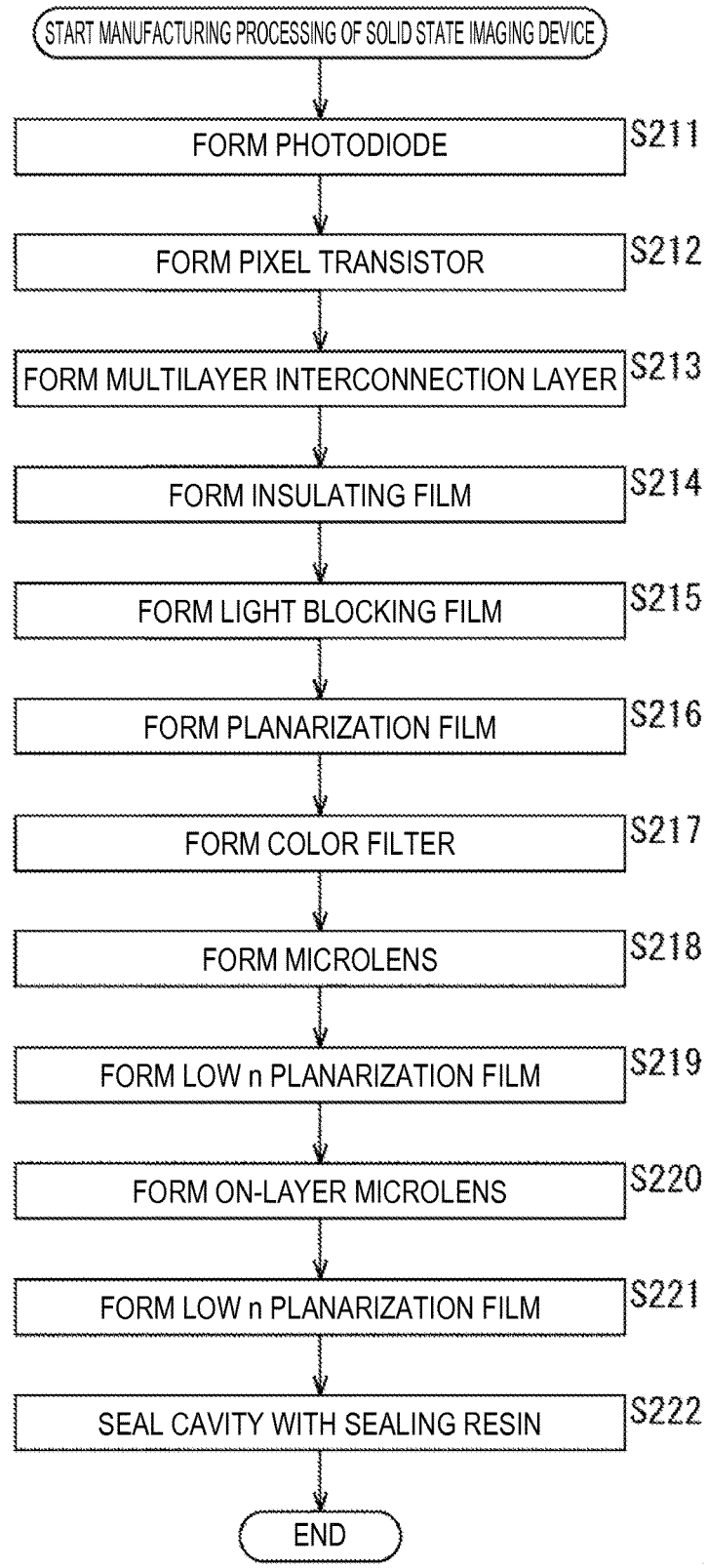
FIG. 14 is a flow chart describing the manufacturing processing of the solid state imaging device of FIG. 13.

The processing of steps S211 to S220 of the flow chart of FIG. 14 is the same as the processing of steps S11 to S20 of the flow chart of FIG. 4, and a description thereof is omitted.

That is, after the on-layer microlens 45 is formed in step S220, the low n planarization film 201 is formed on the low n planarization film 44 including the on-layer microlens 45 in step S221.

Then, in step S222, the cavity is sealed with the sealing resin 202. Specifically, the sealing resin 202 is formed on the low n planarization film 201, and the sealing glass 203 is formed on the sealing resin 202; thus, the cavity is sealed.

By the above processing, it becomes possible to obtain the effect by the cavity-less CSP structure, while obtaining a configuration that solves the trade-off in which reducing the height of the imaging pixel and increasing the height of the phase difference detecting pixel are required in a back-side illumination solid state imaging device including an imaging element and a phase difference detecting pixel.

Modification examples of the embodiment will now be described.

Modification Example 1

Figure 15:
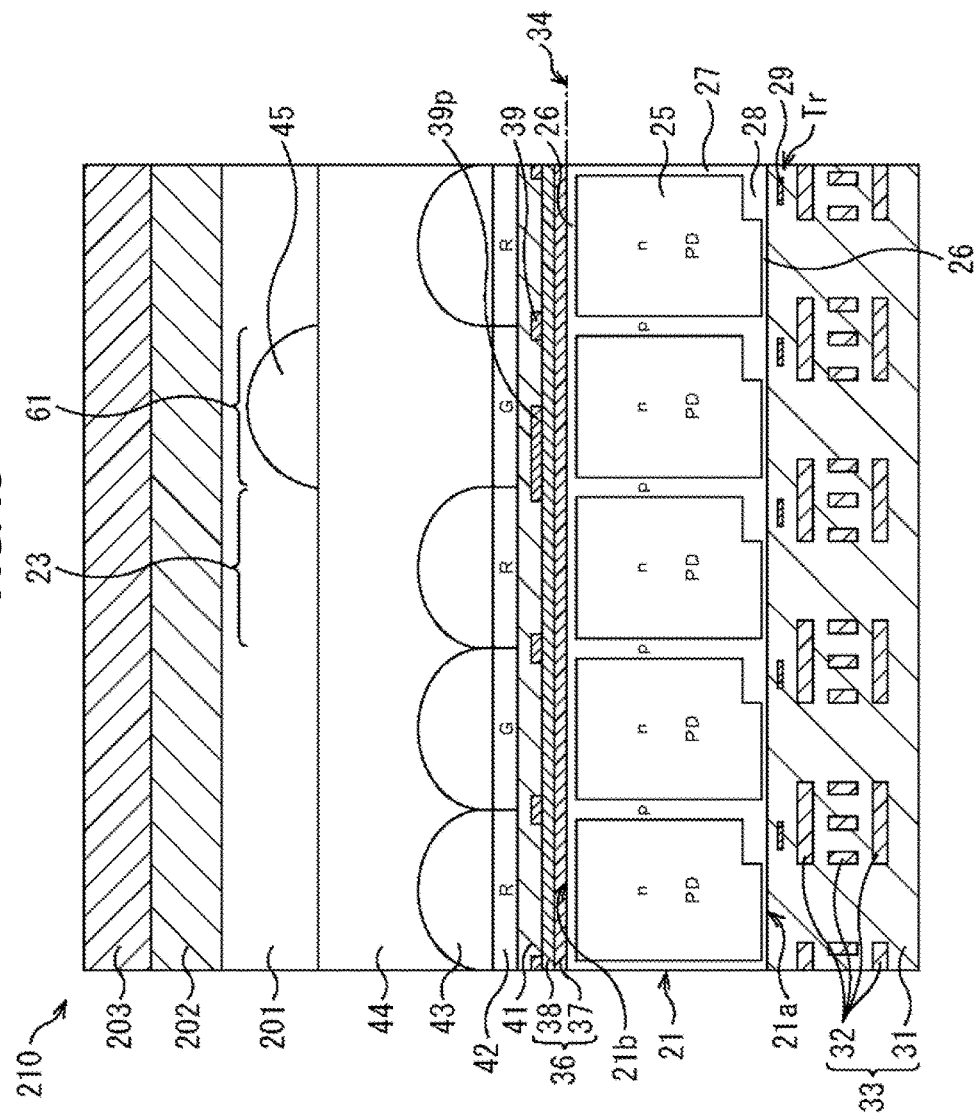
FIG. 15 is a cross-sectional view showing a modification example of the solid state imaging device.

FIG. 15 shows a modification example of the third embodiment of the solid state imaging device of the present technology.

In a solid state imaging device 210 of FIG. 15, components having the same functions as those provided in the solid state imaging device 200 of FIG. 13 are marked with the same names and the same reference numerals, and a description thereof is omitted as appropriate.

The solid state imaging device 210 of FIG. 15 is configured such that the microlens 43 is not formed in the phase difference detecting pixel 61.

By such a configuration, in the solid state imaging device 210 of FIG. 15, the light collection characteristics are not influenced by the variation in lens formation and the accuracy of phase difference AF can be improved similarly to the phase difference detecting pixel 61 of FIG. 8.

Modification Example 2

Figure 16:
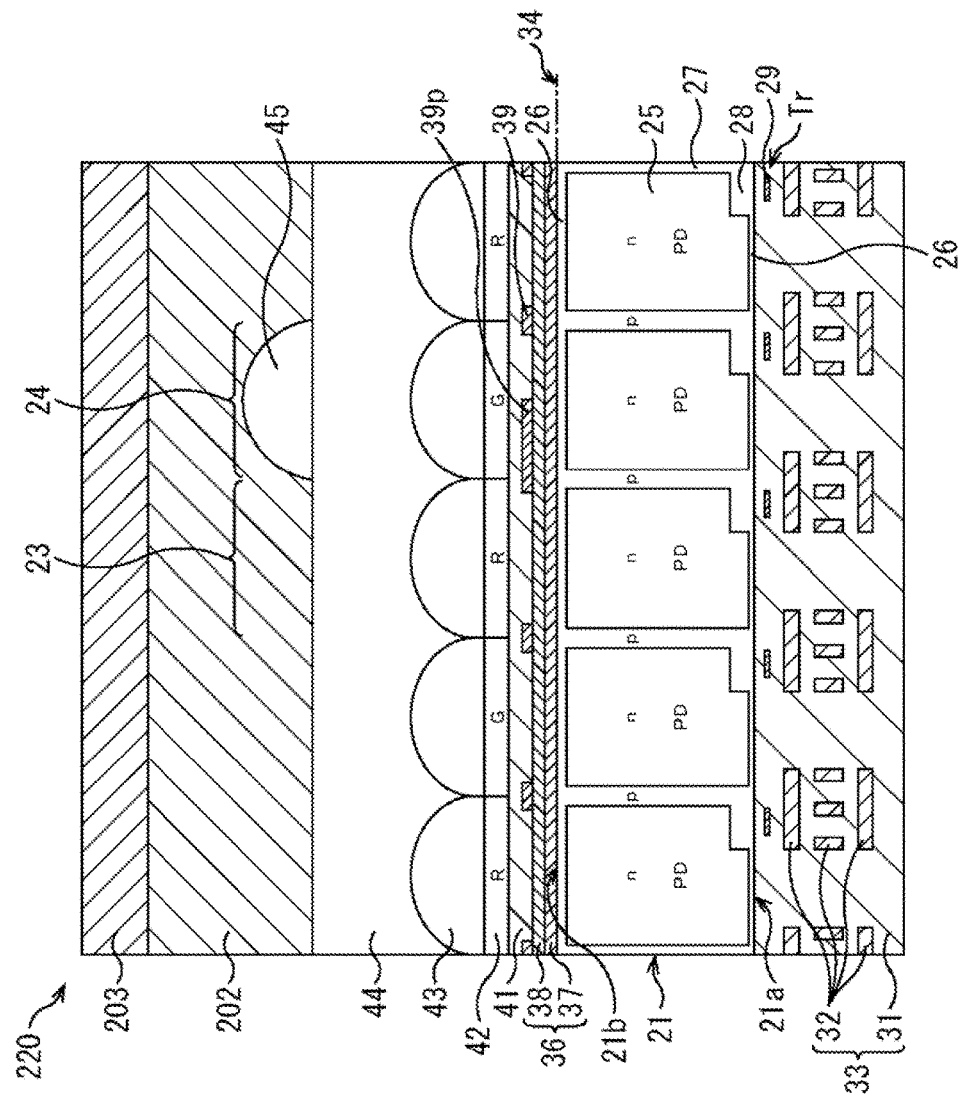
FIG. 16 is a cross-sectional view showing a modification example of the solid state imaging device.

FIG. 16 shows another modification example of the third embodiment of the solid state imaging device of the present technology.

In a solid state imaging device 220 of FIG. 16, components having the same functions as those provided in the solid state imaging device 200 of FIG. 13 are marked with the same names and the same reference numerals, and a description thereof is omitted as appropriate.

In the solid state imaging device 220 of FIG. 16, on the low n planarization film 44 including the on-layer microlens 45, the low n planarization film 201 is not formed but the sealing resin 202 is formed. The sealing glass 203 is formed on the sealing resin 202. In this case, the processing of step S221 is skipped in the flow chart of FIG. 14.

In this example, the on-layer microlens 45 is formed of a material with a refractive index higher than the refractive index (generally approximately 1.5) of the sealing resin 202, for example formed of a SiN-based or SiON-based inorganic material. As described above, the refractive index of SiN is set to approximately 1.9 to 2.0 and the refractive index of SiON is set to approximately 1.45 to 1.9.

By such a configuration, the process of forming the low n planarization film 201 can be omitted.

Modification Example 3

Figure 17:
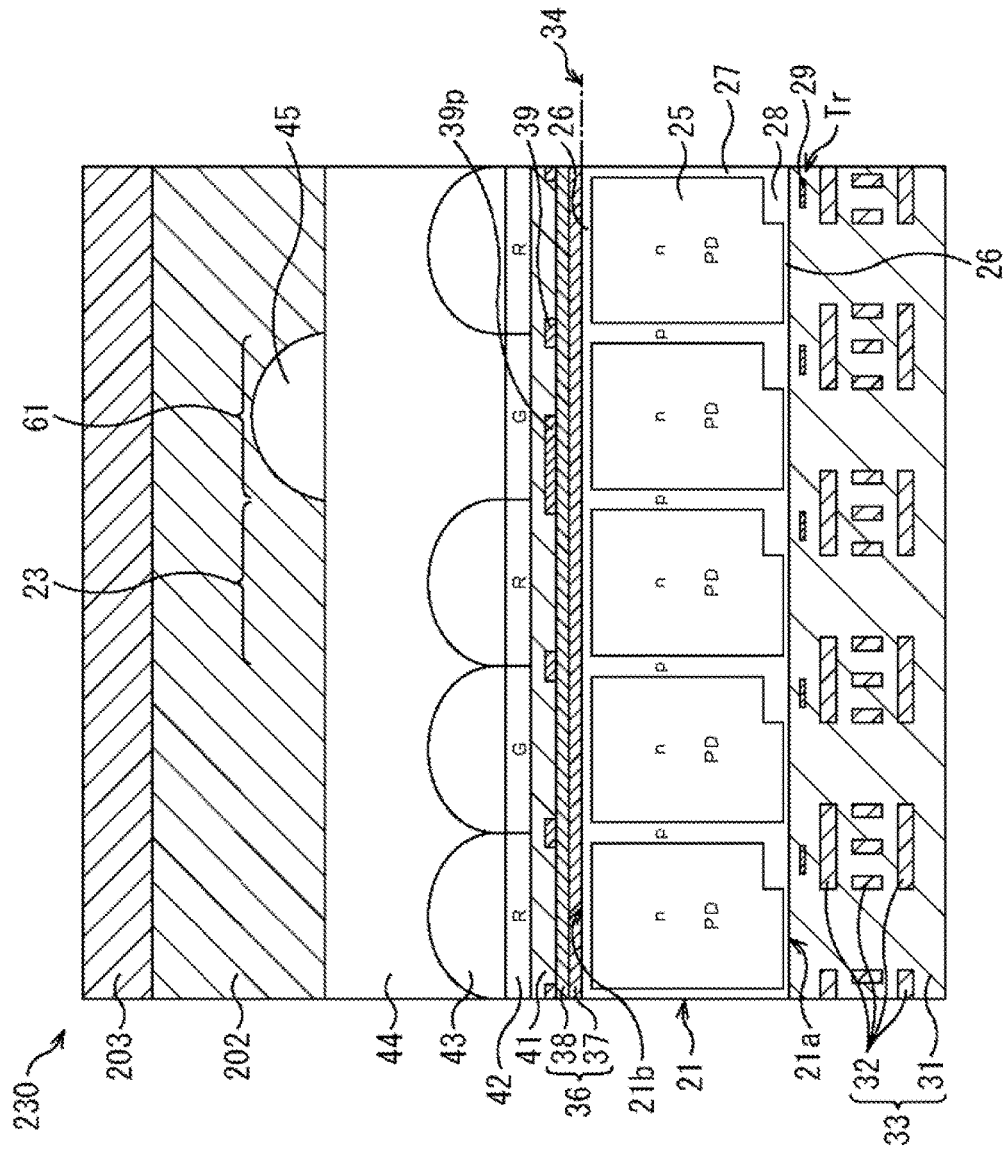
FIG. 17 is a cross-sectional view showing a modification example of the solid state imaging device.

FIG. 17 shows yet another modification example of the third embodiment of the solid state imaging device of the present technology.

In a solid state imaging device 230 of FIG. 17, components having the same functions as those provided in the solid state imaging device 220 of FIG. 16 are marked with the same names and the same reference numerals, and a description thereof is omitted as appropriate.

The solid state imaging device 230 of FIG. 17 is configured such that the microlens 43 is not formed in the phase difference detecting pixel 61.

By such a configuration, the accuracy of phase difference AF can be improved and the process of forming the low n planarization film 201 can be omitted.

Modification Example 4

Figure 18:
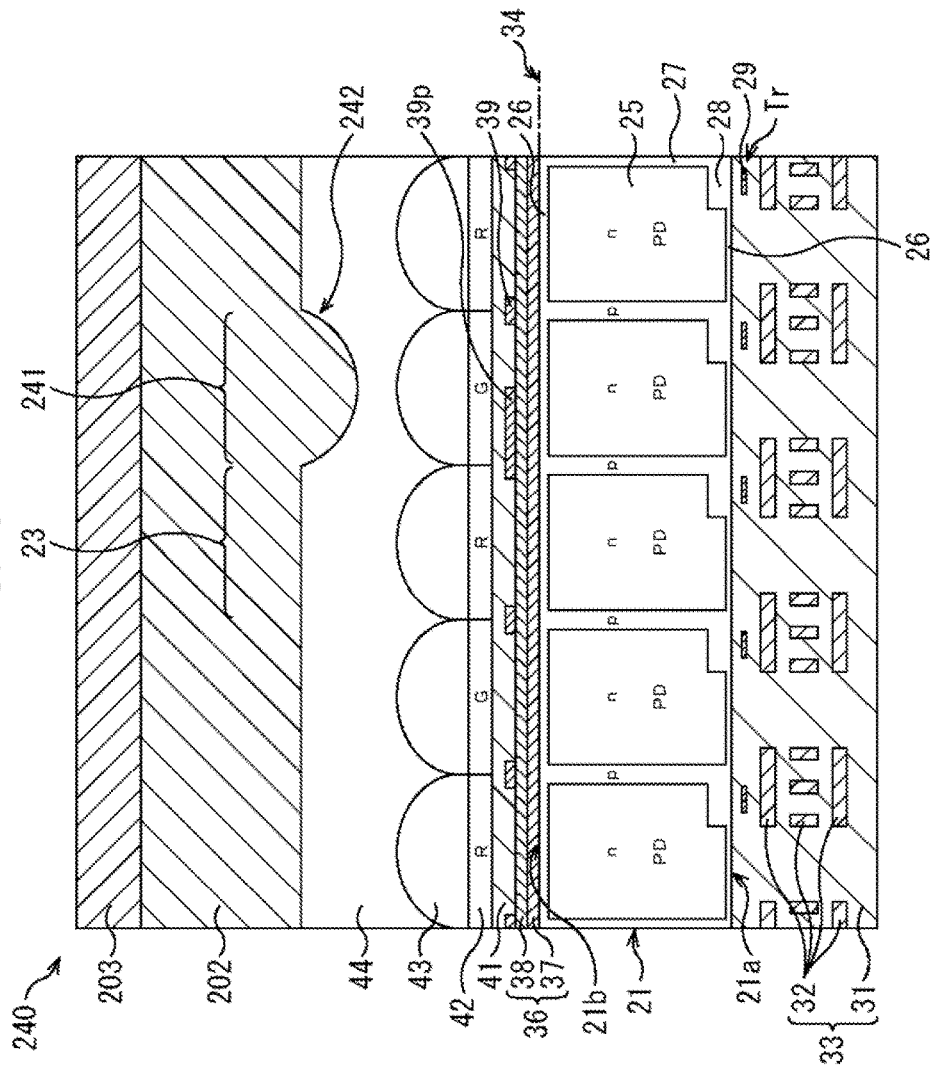
FIG. 18 is a cross-sectional view showing a modification example of the solid state imaging device.

FIG. 18 shows yet another modification example of the third embodiment of the solid state imaging device of the present technology.

In a solid state imaging device 240 of FIG. 18, components having the same functions as those provided in the solid state imaging device 220 of FIG. 16 are marked with the same names and the same reference numerals, and a description thereof is omitted as appropriate.

The solid state imaging device 240 of FIG. 18 is configured such that an on-layer microlens 242 of a downward convex shape is formed in a phase difference detecting pixel 241.

The on-layer microlens 242 is formed by a concavity formed on the low n planarization film 44 of the phase difference detecting pixel 241 being sealed with a sealing resin with a higher refractive index than the low n planarization film 44.

[Flow of the Manufacturing Processing of the Solid State Imaging Device]

Next, the manufacturing processing of the solid state imaging device 240 is described with reference to the flow chart of FIG. 19.

Figure 19:
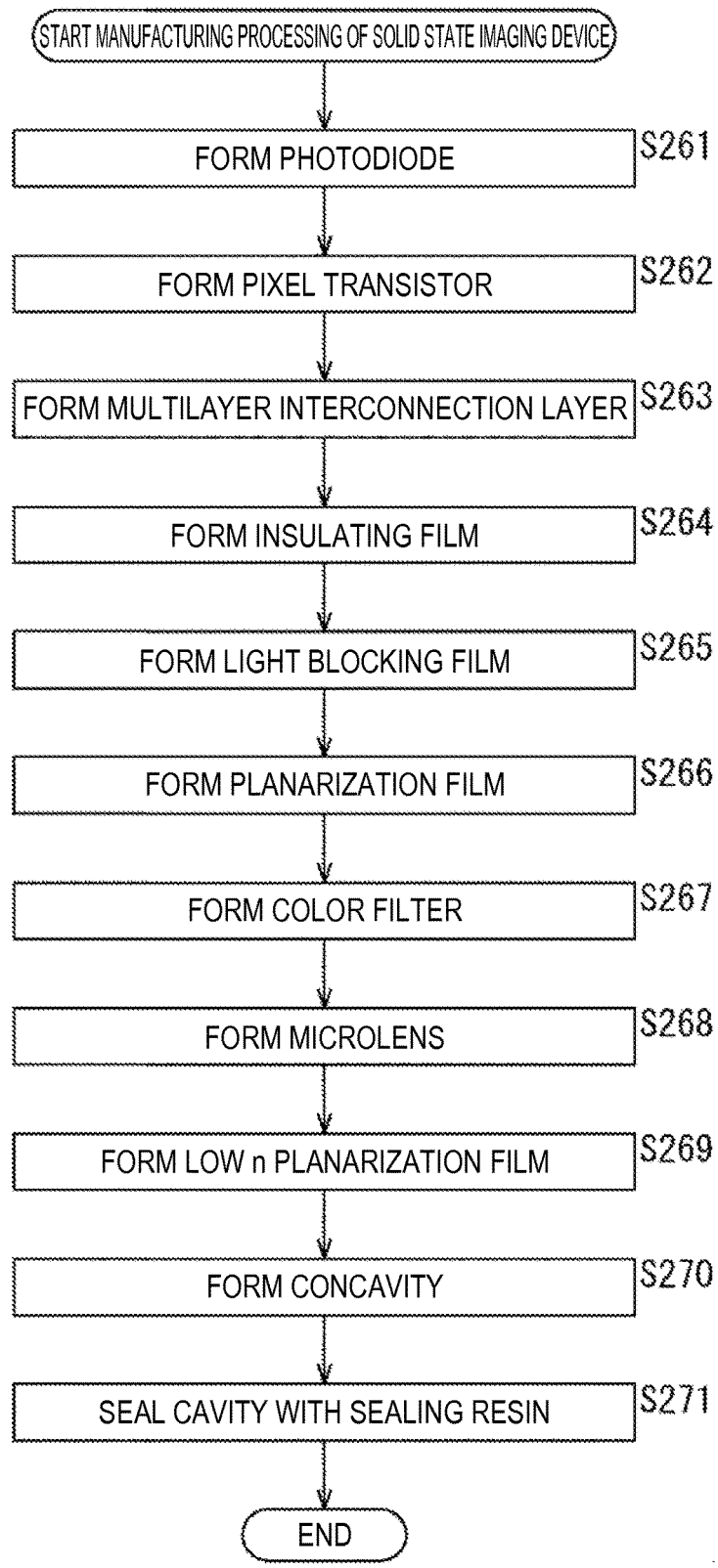
FIG. 19 is a flow chart describing the manufacturing processing of the solid state imaging device of FIG. 18.

The processing of steps S261 to S269 of the flow chart of FIG. 19 is the same as the processing of steps S211 to S219 of the flow chart of FIG. 14, and a description thereof is omitted.

That is, after the low n planarization film 44 is formed in step S269, a concavity is formed on the low n planarization film 44 in step S270.

Specifically, using, for example, the method disclosed in JP 4705499, a convex lens is formed using a resist on the low n planarization film 44 of the phase difference detecting pixel 241, planarization is performed using a material of a lower etching rate than the convex lens, and etching is advanced; thereby, a concavity is formed on the low n planarization film 44.

The method for forming a concavity is not limited to the method described above; for example, a concavity may be formed by forming a pinhole using a resist and performing isotropic wet etching, or a concavity of a lens shape may be formed by forming a rectangular opening on the low n planarization film 44 by anisotropic dry etching and performing reflow.

Then, in step S271, the cavity is sealed with the sealing resin 202. Specifically, the sealing resin 202 is formed on the low n planarization film 201, and the sealing glass 203 is formed on the sealing resin 202; thereby, the on-layer microlens 242 of a downward convex shape is formed and the cavity is sealed.

By the above processing, the process of applying the lens material of the on-layer microlens can be omitted.

Modification Example 5

Figure 20:
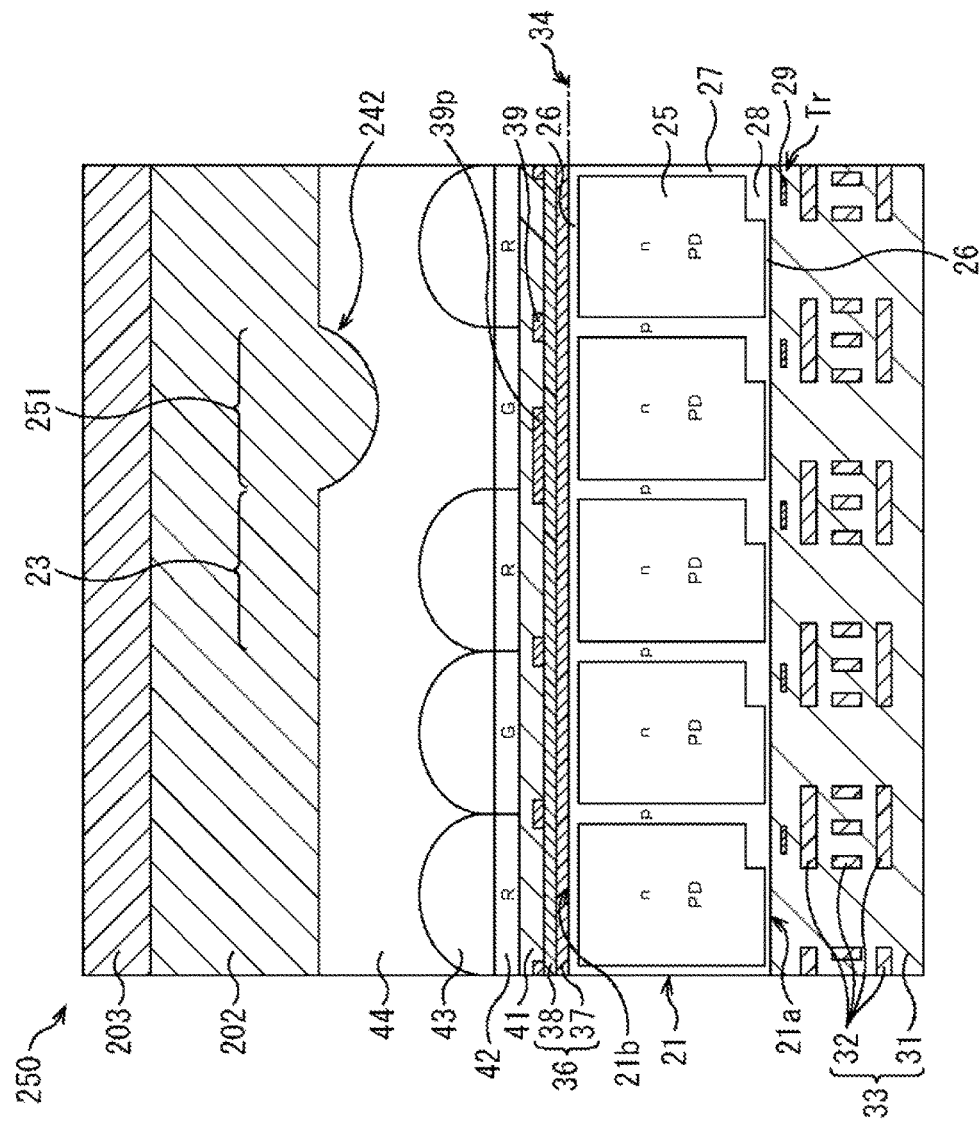
FIG. 20 is a cross-sectional view showing a modification example of the solid state imaging device.

FIG. 20 shows yet another modification example of the third embodiment of the solid state imaging device of the present technology.

In a solid state imaging device 250 of FIG. 20, components having the same functions as those provided in the solid state imaging device 240 of FIG. 18 are marked with the same names and the same reference numerals, and a description thereof is omitted as appropriate.

The solid state imaging device 250 of FIG. 20 is configured such that the microlens 43 is not formed in a phase difference detecting pixel 251.

By such a configuration, in the solid state imaging device 250 of FIG. 20, the light collection characteristics are not influenced by the variation in lens formation and the accuracy of phase difference AF can be improved similarly to the phase difference detecting pixel 61 of FIG. 8.

In the above, configurations in which the present technology is applied to a back-side illumination CMOS solid state imaging device are described, but the present technology may be applied to solid state imaging devices such as front-side illumination CMOS solid state imaging devices and charge coupled device (CCD) solid state imaging devices.

The present technology is not limited to applications to solid state imaging devices, but may be applied also to imaging devices. Herein, the imaging device refers to camera systems such as digital still cameras and digital video cameras and electronic devices having an imaging function such as mobile phones. Also module-like configurations installed in electronic devices, namely, camera modules may be referred to as imaging devices.

5. Fourth Embodiment

[Configuration of the Electronic Device]

Here, an example of the configuration of an electronic device of a fourth embodiment of the present technology is described with reference to FIG. 21.

Figure 21:
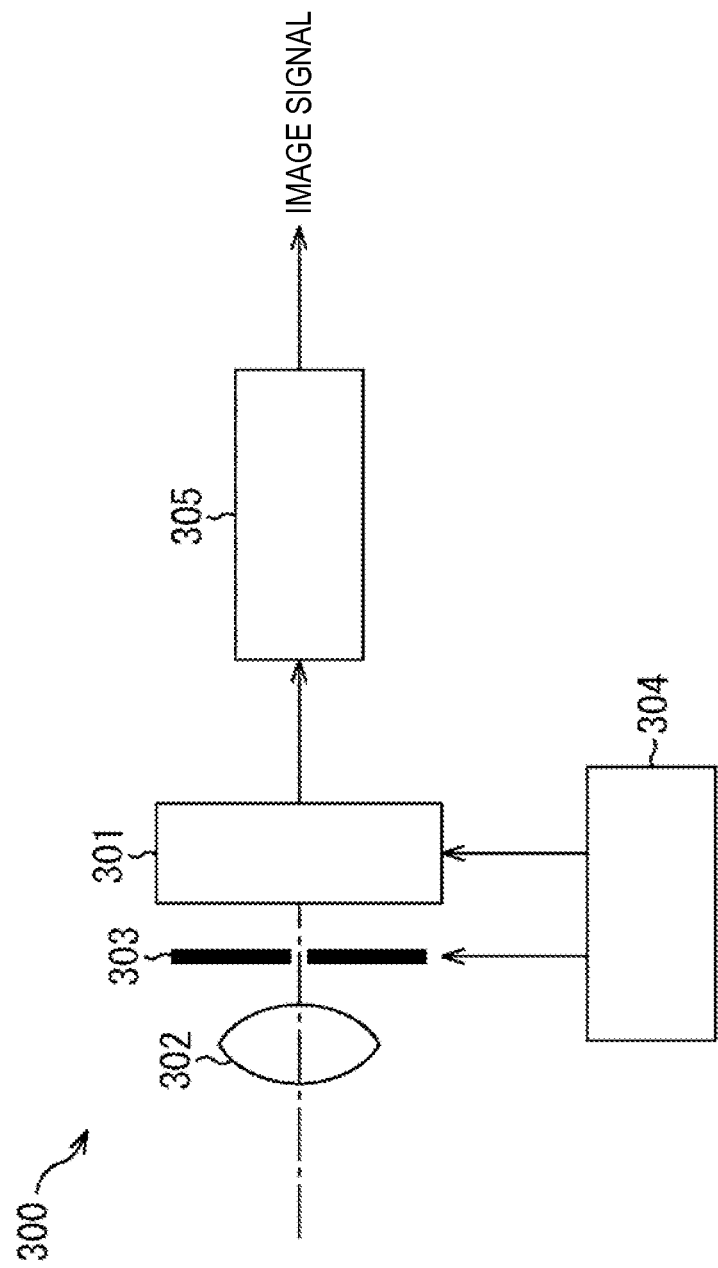
FIG. 21 is a block diagram showing an example of the configuration of an electronic device of a fourth embodiment of the present technology.

An electronic device 300 shown in FIG. 21 includes a solid state imaging device 301, an optical lens 302, a shutter device 303, a drive circuit 304, and a signal processing circuit 305. As the solid state imaging device 301, the solid state imaging device of any of the first to third embodiments of the present technology described above is provided.

The optical lens 302 causes image light (incident light) from a subject to form an image on the imaging surface of the solid state imaging device 301. Thereby, signal charge is stored in the solid state imaging device 301 for a certain period of time. The shutter device 303 controls the light irradiation period and the light blocking period to the solid state imaging device 301.

The drive circuit 304 supplies a drive signal that controls the signal transfer operation of the solid state imaging device 301 and the shutter operation of the shutter device 303. The solid state imaging device 301 performs signal transfer by means of the drive signal (timing signal) supplied from the drive circuit 304. The signal processing circuit 305 performs various signal processings on the signal outputted from the solid state imaging device 301. The image signal that has undergone signal processing is stored in a storage medium such as a memory or is outputted to a monitor.

Figure 22:
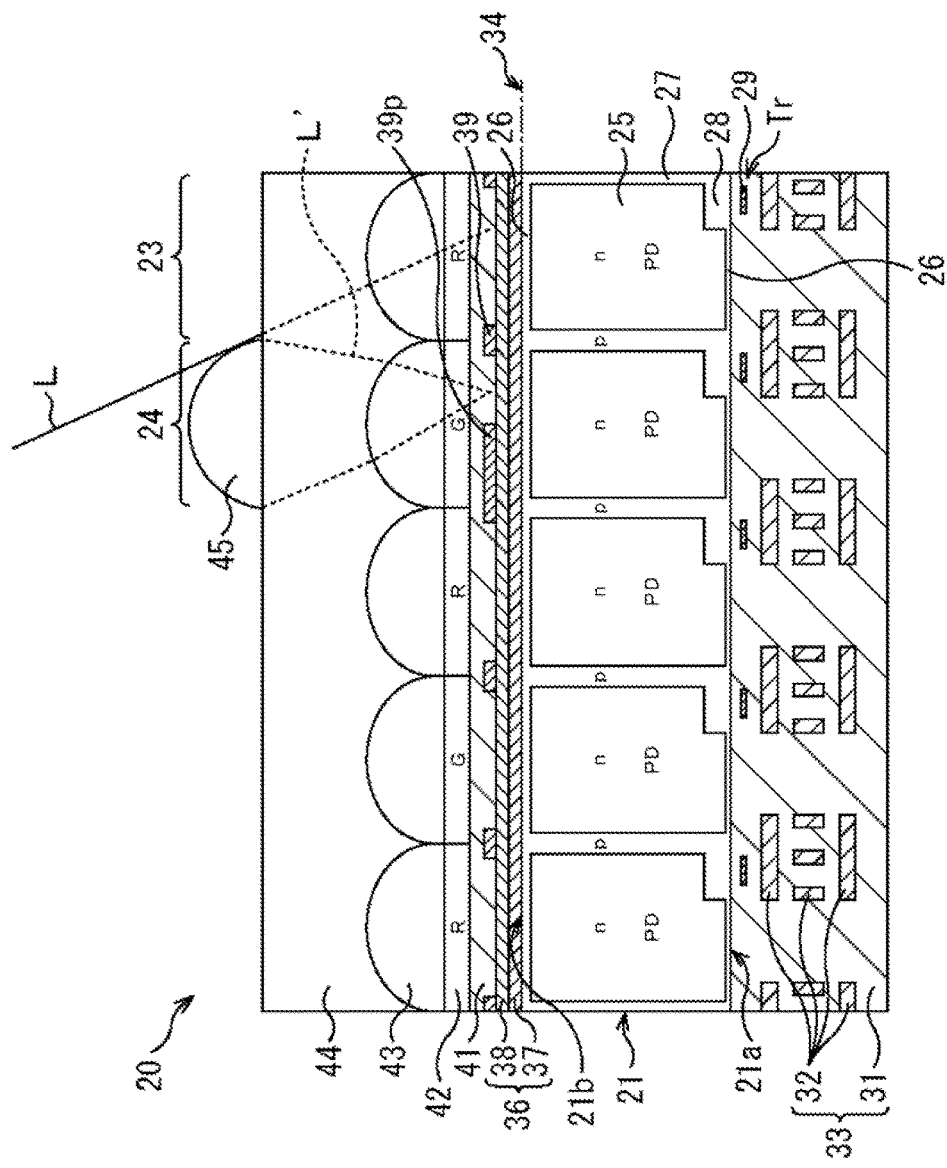
FIG. 22 is a view describing shading.

In the solid state imaging device of the present technology, for example in the solid state imaging device 20 of the first embodiment, as shown in FIG. 22, part of the incident light L that is originally supposed to be taken into an adjacent imaging pixel 23 will be taken into the phase difference detecting pixel 24 as light L' due to the on-layer microlens 45, and consequently shading will occur in the imaging pixel 23.

Hence, the signal processing circuit 305 of the electronic device 300 performs the processing of correcting the shading occurring in an imaging pixel 23 adjacent to the phase difference detecting pixel 24 on the signal outputted from the solid state imaging device 301.

When a uniform subject is imaged by an electronic device including the solid state imaging device of the present technology, the signal outputted from the solid state imaging device exhibits different image height dependences between imaging pixels around the phase difference detecting pixel. This depends also on the relative position of the imaging pixel to the phase difference detecting pixel.

Hence, a shading function $G(x, y, i)$ expressing the degree of shading corresponding to the placement of the imaging pixel that is a target of the shading correction is found beforehand from the signal (pixel value). Here, x and y are coordinates showing the two-dimensional placement of the imaging pixel in the pixel region, and i represents the relative position of the imaging pixel to the phase difference detecting pixel.

The shading function G(x, y, i) is found and databased for each lens parameter (lens type, zoom value, F value, etc.) of the optical lens 302. Here, it is possible to reduce the memory capacity necessary for databasing by simplifying the shading function G(x, y, i) using a polynomial approximation or the like in view of the symmetry of the pixel region.

The signal processing circuit 305 reads, based on the lens parameter of the optical lens 302, the corresponding shading function G(x, y, i), and performs deduction in accordance with the shading function G(x, y, i) on the signal outputted from the solid state imaging device 301 obtained by the actual imaging; thereby, corrects the shading.

It is also possible to find the shading function G(x, y, i) as a model function in accordance with the lens parameter, not finding the shading function G(x, y, i) for each lens parameter.

By the above configuration, in the solid state imaging device of the present technology, it becomes possible to reduce the shading occurring in an imaging pixel adjacent to the on-layer microlens.

The signal processing circuit 305 may correct shading using the output of an imaging pixel of the same color nearest to the imaging pixel that is a target of the shading correction, without using the shading function G(x, y, i).

The embodiment of the present technology is not limited to the embodiments described above, and may be variously modified without departing from the spirit of the present invention.

Additionally, the present technology may also be configured as below.

(1)

A solid state imaging device including a plurality of imaging pixels arranged two-dimensionally in a matrix configuration and phase difference detecting pixels arranged scatteredly among the imaging pixels, the solid state imaging device including:

a first microlens formed for each of the imaging pixels;

a planarization film having a lower refractive index than the first microlens and formed on the first microlens; and a second microlens formed only on the planarization film of the phase difference detecting pixel.

(2)

The solid state imaging device according to (1), wherein the first microlens is formed also in the phase difference detecting pixel.

(3)

The solid state imaging device according to (1) or (2), wherein a refractive index of the planarization film is set to 1.5 or less and a refractive index of the first and second microlenses is set to 1.4 or more.

(4)

The solid state imaging device according to any of (1) to (3), wherein the second microlens has same composition as the planarization film.

(5)

The solid state imaging device according to any of (1) to (4), wherein the planarization film is formed by fluorine or hollow silica being added to an acrylic-based resin or a siloxane-based resin.

(6)

The solid state imaging device according to any of (1) to (5), wherein the first and second microlenses are made of an organic material of a styrene-based resin, an acrylic-based resin, a styrene-acrylic copolymer-based resin, or a siloxane-based resin.

(7)

The solid state imaging device according to any of (1) to (5), wherein the first and second microlenses are made of an organic-inorganic hybrid material in which TiO fine particles are dispersed in a styrene-based resin, an acrylic-based resin, a styrene-acrylic copolymer-based resin, a siloxane-based resin, or a polyimide resin.

(8)

The solid state imaging device according to any of (1) to (5), wherein the first and second microlenses are made of a SiN-based or SiON-based inorganic material.

(9)

The solid state imaging device according to any of (1) to (8), wherein a light blocking wall is formed in a boundary portion between the phase difference pixel and the imaging pixel in the planarization film.

(10)

The solid state imaging device according to any of (1) to (9), wherein a space on a light receiving surface side is sealed with a sealing glass and a sealing resin.

(11)

The solid state imaging device according to (10), wherein a planarization film with a lower refractive index than the first and second microlenses is further formed on the second microlens, and the space on the planarization film is sealed with the sealing glass and the sealing resin.

(12)

The solid state imaging device according to (10), wherein the space on the second microlens is sealed with the sealing glass and the sealing resin, and a refractive index of the second microlens is sufficiently higher than a refractive index of the sealing resin.

(13)

The solid state imaging device according to (10), wherein the second microlens is formed by a concavity formed on the planarization film being sealed with the sealing resin with a higher refractive index than the planarization film.

(14)

The solid state imaging device according to any of (10) to (13), wherein the sealing resin is made of an acrylic-based resin, a silicone-based resin, or an epoxy-based resin.

(15)

A method for manufacturing a solid state imaging device including a plurality of imaging pixels arranged two-dimensionally in a matrix configuration and phase difference detecting pixels arranged scatteredly among the imaging pixels, the method including steps of:

forming a first microlens for each of the imaging pixels;

forming a planarization film with a lower refractive index than the first microlens on the first microlens; and forming a second microlens only on the planarization film of the phase difference detecting pixel.

(16)

An electronic device including:
a solid state imaging device including a plurality of imaging pixels arranged two-dimensionally in a matrix configuration and phase difference detecting pixels arranged scatteredly among the imaging pixels, the solid state imaging device including
   a first microlens formed for each of the imaging pixels,
   a planarization film having a lower refractive index than the first microlens and formed on the first microlens, and
   a second microlens formed only on the planarization film of the phase difference detecting pixel;
a signal processing circuit configured to process an output signal outputted from the solid state imaging device; and
a lens configured to cause incident light to be incident on the solid state imaging device.

(17)

The electronic device according to (16), wherein
the signal processing circuit corrects shading occurring in the imaging pixel placed near the phase difference detecting pixel.

(18)

The electronic device according to (17), wherein
the signal processing circuit corrects the shading using a shading function found beforehand which expresses a degree of shading corresponding to the placement of the imaging pixel that is a target of the shading correction.

(19)

The electronic device according to (18), wherein
the shading function is found in accordance with a lens parameter of the lens portion.

(20)

The electronic device according to (17), wherein
the signal processing circuit corrects the shading using an output of the imaging pixel of same color nearest to the imaging pixel that is a target of the shading correction.

REFERENCE SIGNS LIST 20 solid state imaging device
23 imaging pixel
24 phase difference detecting pixel
43 microlens
44 low n planarization film
45 on-layer microlens
60 solid state imaging device
61 phase difference detecting pixel
70 solid state imaging device
71 phase difference detecting pixel
72 on-layer microlens
80 solid state imaging device
81 phase difference detecting pixel
100 solid state imaging device
101 phase difference detecting pixel
102 light blocking wall
200 solid state imaging device
201 low n planarization film
202 sealing resin
203 sealing glass
210 solid state imaging device
220 solid state imaging device
230 solid state imaging device
240 solid state imaging device
241 phase difference detecting pixel
242 on-layer microlens
250 solid state imaging device
251 phase difference detecting pixel
300 electronic device
301 solid state imaging device
305 signal processing circuit

The invention claimed is:

1. A solid state imaging device including a plurality of imaging pixels arranged two-dimensionally in a matrix configuration and phase difference detecting pixels arranged scatteredly among the imaging pixels, the solid state imaging device comprising:
a plurality of first microlenses, wherein one first microlens is formed for each of the imaging pixels;
a planarization film having a lower refractive index than the first microlenses and formed on the first microlenses; and
a plurality of second microlenses formed on the planarization film, wherein one second microlens is formed for each of the phase difference detecting pixels, and wherein no second microlens is formed for any of the imaging pixels.

2. The solid state imaging device according to claim 1, wherein one first microlens is also formed for each of the phase difference detecting pixels.

3. The solid state imaging device according to claim 1, wherein
a refractive index of the planarization film is set to 1.5 or less and a refractive index of the first and second microlenses is set to 1.4 or more.

4. The solid state imaging device according to claim 1, wherein
the second microlens has same composition as the planarization film.

5. The solid state imaging device according to claim 1, wherein
the planarization film is formed by fluorine or hollow silica being added to an acrylic-based resin or a siloxane-based resin.

6. The solid state imaging device according to claim 1, wherein
the first and second microlenses are made of an organic material of a styrene-based resin, an acrylic-based resin, a styrene-acrylic copolymer-based resin, or a siloxane-based resin.

7. The solid state imaging device according to claim 1, wherein
the first and second microlenses are made of an organic-inorganic hybrid material in which TiO fine particles are dispersed in a styrene-based resin, an acrylic-based resin, a styrene-acrylic copolymer-based resin, a siloxane-based resin, or a polyimide resin.

8. The solid state imaging device according to claim 1, wherein
the first and second microlenses are made of a SiN-based or SiON-based inorganic material.

9. The solid state imaging device according to claim 1, wherein
a light blocking wall is formed in a boundary portion between the phase difference detecting pixel and the imaging pixels in the planarization film.

10. The solid state imaging device according to claim 1, wherein
a space on a light receiving surface side is sealed with a sealing glass and a sealing resin.

11. The solid state imaging device according to claim 10, wherein
a planarization film with a lower refractive index than the first and second microlenses is further formed on the second microlenses, and
the space on the planarization film is sealed with the sealing glass and the sealing resin.

12. The solid state imaging device according to claim 10, wherein
the space on the second microlenses is sealed with the sealing glass and the sealing resin, and
a refractive index of the second microlenses is sufficiently higher than a refractive index of the sealing resin.

13. The solid state imaging device according to claim 10, wherein
the second microlenses formed by a concavity formed on the planarization film being sealed with the sealing resin with a higher refractive index than the planarization film.

14. The solid state imaging device according to claim 10, wherein
the sealing resin is made of an acrylic-based resin, a silicone-based resin, or an epoxy-based resin.

15. A method for manufacturing a solid state imaging device including a plurality of imaging pixels arranged two-dimensionally in a matrix configuration and phase difference detecting pixels arranged scatteredly among the imaging pixels, the method comprising steps of:
forming a plurality of first microlenses, wherein one first microlens is formed for each of the imaging pixels;
forming a planarization film with a lower refractive index than the first microlenses on the first microlenses; and
forming a plurality of second microlenses on the planarization film, wherein one second microlens is formed for each of the phase difference detecting pixels, and wherein no second microlens is formed for any of the imaging pixels.

16. An electronic device comprising:
a solid state imaging device including a plurality of imaging pixels arranged two-dimensionally in a matrix configuration and phase difference detecting pixels arranged scatteredly among the imaging pixels, the solid state imaging device including:
a plurality of first microlenses, wherein one first microlens is formed for each of the imaging pixels;
a planarization film having a lower refractive index than the first microlenses and formed on the first microlenses; and
a plurality of second microlenses formed on the planarization film, wherein one second microlens is formed for each of the phase difference detecting pixels, and wherein no second microlens is formed for any of the imaging pixels;
a signal processing circuit configured to process an output signal outputted from the solid state imaging device; and
a lens configured to cause incident light to be incident on the solid state imaging device.

17. The electronic device according to claim 16, wherein the signal processing circuit corrects shading occurring in at least one of the imaging pixels placed near at least one of the phase difference detecting pixels.

18. The electronic device according to claim 17, wherein the signal processing circuit corrects the shading using a shading function found beforehand which expresses a degree of shading corresponding to the placement of the at least one of the imaging pixels that is a target of the shading correction.

19. The electronic device according to claim 18, wherein the shading function is found in accordance with a lens parameter of the lens portion.

20. The electronic device according to claim 17, wherein the signal processing circuit corrects the shading using an output of the imaging pixel of same color nearest to the at least one of the imaging pixels that is a target of the shading correction.

* * * * *